US008807775B2

(12) United States Patent
Sekiguchi et al.

(10) Patent No.: US 8,807,775 B2
(45) Date of Patent: Aug. 19, 2014

(54) ARRAY-TYPE DISPLAY APPARATUS

(71) Applicant: Dai Nippon Printing Co., Ltd., Tokyo (JP)

(72) Inventors: Hiroshi Sekiguchi, Tokyo (JP); Masahiro Goto, Tokyo (JP); Katsunori Takahashi, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 14/081,082

(22) Filed: Nov. 15, 2013

(65) Prior Publication Data

US 2014/0071657 A1   Mar. 13, 2014

Related U.S. Application Data

(63) Continuation of application No. 14/117,156, filed as application No. PCT/JP2013/058786 on Mar. 26, 2013.

(30) Foreign Application Priority Data

Mar. 26, 2012 (JP) ................. 2012-069921
Jun. 20, 2012 (JP) ................. 2012-139235

(51) Int. Cl.
| G09G 5/00 | (2006.01) |
| G09F 9/302 | (2006.01) |
| F21V 33/00 | (2006.01) |
| G09F 9/35 | (2006.01) |
| G02B 5/10 | (2006.01) |
| G09F 9/33 | (2006.01) |
| G09F 9/30 | (2006.01) |
| G02F 1/1333 | (2006.01) |

(52) U.S. Cl.
CPC ............... *G02B 5/10* (2013.01); *G09F 9/3026* (2013.01); *F21V 33/0052* (2013.01); *G09F 9/35* (2013.01); *G02B 6/0078* (2013.01); *G09F 9/33* (2013.01); *G02B 6/0015* (2013.01); *G09F 9/30* (2013.01); *G02F 1/1333* (2013.01)
USPC ......... 362/97.1; 362/606; 362/619; 362/97.2; 359/449; 313/110

(58) Field of Classification Search
CPC .. G02B 6/0078; G02B 6/0075; G02B 6/0015; G02B 6/0073; G02B 6/0011; G02B 6/002; G02B 27/026; G02B 5/10; G09F 13/04; G09F 13/0413; G09F 9/30; G09F 9/3026; G09F 9/35; F21V 33/0052
USPC .............................. 362/97, 1–97.3
See application file for complete search history.

(56) References Cited

U.S. PATENT DOCUMENTS

| 5,656,893 | A | 8/1997 | Shino et al. |
| 6,927,908 | B2* | 8/2005 | Stark ............................ 359/449 |
| 8,472,114 | B2* | 6/2013 | Watanabe ..................... 359/443 |
| 8,541,934 | B2* | 9/2013 | Watanabe et al. ............ 313/110 |
| 2004/0051944 | A1 | 3/2004 | Stark |
| 2011/0102302 | A1* | 5/2011 | Watanabe et al. ................. 345/4 |
| 2011/0109535 | A1* | 5/2011 | Watanabe et al. ............... 345/87 |
| 2011/0242686 | A1 | 10/2011 | Watanabe |
| 2013/0335673 | A1* | 12/2013 | Moriwaki ....................... 349/63 |

FOREIGN PATENT DOCUMENTS

| JP | 05-188873 A1 | 7/1993 |
| JP | 08-063110 A1 | 3/1996 |
| JP | 2000-122571 A1 | 4/2000 |
| JP | 2004-524551 A1 | 8/2004 |
| JP | 2007-192977 A1 | 8/2007 |
| WO | 02/42838 A1 | 5/2002 |
| WO | 2008/149449 A1 | 12/2008 |
| WO | 2009/157161 A1 | 12/2009 |
| WO | 2010/070871 A1 | 6/2010 |

OTHER PUBLICATIONS

Extended European Search Report (Application No. 14000271.8) dated Apr. 4, 2014.
International Search Report and Written Opinion dated May 28, 2013.

* cited by examiner

Primary Examiner — Diane Lee
Assistant Examiner — Kenny C Sokolowski
(74) *Attorney, Agent, or Firm* — Burr & Brown, PLLC

(57) ABSTRACT

An array-type display apparatus includes display devices each including a display section and a non-display area located around the display section, and transparent plates disposed on the viewer side. Each transparent plate has: a light exit-side deflection portion, provided in a position corresponding to the non-display area, for allowing at least part of light from the display section to exit the transparent plate in the front direction of the display section; and corner deflection portions, provided at the corners of the viewer-side surface, for allowing at least part of light that has passed through the transparent plate to exit it in the front direction. The width of the light exit-side deflection portion is larger than the width of the non-display area.

10 Claims, 24 Drawing Sheets

ARRAY-TYPE DISPLAY APPARATUS

TECHNICAL FIELD

The present invention relates to an array-type display apparatus having a display screen formed by an array of display devices.

BACKGROUND ART

Array-type display apparatuses having an enlarged size of display screen, comprised of an array of display apparatuses such as rear projection display devices, plasma display devices, liquid crystal display devices or organic EL (electroluminescence) (organic LED (light-emitting diode)) display devices, are widely used in applications such as digital signage, control monitoring, etc. for which a large display screen of the size of at least tens of inches is required.

In order for an array-type display apparatus to display better images, various proposals have been made to improve the whether resistance, the flatness, the visibility, etc. of the screen of the display device (see e.g. JP 2007-192977A and JP 2000-122571A).

However, a rear projection display device, for example, needs a frame structure to hold a rear projection screen. In the case of a plasma display device, a liquid crystal display device or an organic EL display device, it has a display section comprised of a glass panel and needs a frame structure to hold the panel.

Because of the frame structure or the like, any such display device has a peripheral non-display area incapable of displaying images. Thus, when an array-type display apparatus is constructed by arraying such display devices in a plane, the non-display areas will form a frame-shaped joint portion between the display devices. The joint portion, incapable of displaying images, has the drawback of discontinuity of an image, which lowers the image quality.

For a plasma display device, a liquid crystal display device, an organic LED display device, or the like, a study is being made of a method which involves attaching a holding member to the end surface of a display panel so as to best reduce the width of the holding member, thereby reducing the non-display area. However, an electrode needs to be provided in a peripheral portion of such a display device, which requires provision of the non-display area at least on the order of a few millimeters even if the narrow holding member is used. Thus, the method achieves no significant improvement in image continuity.

JP 2007-192977A discloses a method which involves disposing an organic LED on a joint portion. However, an electrode needs to be provided around the organic LED. Thus, in fact, the electrode portion is a non-display area. In addition, the method disclosed in the reference entails a complicated construction and an increased production cost.

JP 2000-122571A discloses a method which devises an electrode and wiring e.g. in an FED (Field Emission Display) in order to reduce the width of a joint portion which is a non-display area. However, the improvement in image continuity, achieved by the method of the reference, is insufficient because of the presence of a non-display area due to a sealing agent, wiring connected to the side, etc.

DISCLOSURE OF THE INVENTION

It is an object of the present invention to provide an array-type display apparatus which can significantly reduce the visibility of a non-display area between display devices and can display good images with enhanced image continuity.

According to the present invention, there is provided a first array-type display apparatus comprising:
display devices each including a display section capable of displaying an image, and a non-display area located around the display section and incapable of displaying an image; and transparent plates each disposed nearer to the viewer than the display section of a corresponding display device and covering the display section and the non-display area of the corresponding display device,
wherein the display devices and the transparent plates each have a polygonal shape when viewed in a normal direction of a display surface of the display section,
wherein adjacent transparent plates are disposed in contact with each other,
wherein each transparent plate has:
a light exit-side deflection portion for inwardly bending a traveling direction of at least part of light that has exited the display section and passed through the transparent plate, said light exit-side deflection portion being provided at least in an area of a peripheral part of a viewer-side surface, the area facing the non-display area when viewed in the normal direction of the display surface of the display section; and
corner deflection portions, provided at the corners of the viewer-side surface, for inwardly bending a traveling direction of at least part of light that has exited the corresponding display section and passed through the transparent plate,
wherein the light exit-side deflection portion has a width larger than a width of the non-display area,
wherein the light exit-side deflection portion has a curved surface, curved surfaces arranged in an inner-outer direction, inclined surfaces arranged in the inner-outer direction, or at least one curved surface and at least one inclined surface arranged in the inner-outer direction, and
wherein in the light exit-side deflection portion, an angle formed between a tangent plane of a curved surface at a point on the deflection portion and a plane parallel to the display surface of the display section or an angle formed between an inclined surface at a point on the deflection portion and a plane parallel to the display surface of the display section increases as the point moves outward in the inner-outer direction.

In the first array-type display apparatus according to the present invention, the corner deflection portions may be each inclined with respect to the light exit-side deflection portion.

In the first array-type display apparatus according to the present invention, the corner deflection portions each may have a curved surface, curved surfaces arranged in the inner-outer direction, inclined surfaces arranged in the inner-outer direction, or at least one curved surface and at least one inclined surface arranged in the inner-outer direction,
wherein in each corner deflection portion, an angle formed between a tangent plane of a curved surface at a point on the deflection portion and a plane parallel to the display surface of the display section or an angle formed between an inclined surface at a point on the deflection portion and a plane parallel to the display surface of the display section may increase as the point moves outward in the inner-outer direction, and
wherein when viewed in the normal direction of the display surface of the display section, an innermost point on each corner deflection portion may lie on an outer side of an innermost point on the light exit-side deflection portion.

In the first array-type display apparatus according to the present invention, the corner deflection portions may be formed in areas facing the corners of the non-display area.

In the first array-type display apparatus according to the present invention, the following relation may be satisfied:

$$2 \times W \le W1 \le 4 \times W$$

where W1 represents the width of the light exit-side deflection portion, and W represents the width of the non-display area, as viewed in the normal direction of the display surface of the display section.

In the first array-type display apparatus according to the present invention, each transparent plate may further have a light entrance-side deflection portion for outwardly bending a traveling direction of at least part of light that has exited the display section, said light entrance-side deflection portion being provided at least in an area of a peripheral part of a display device-side surface, the area facing the display section when viewed in the normal direction of the display surface of the display section.

According to the present invention, there is provided a second array-type display apparatus comprising:
display devices each including a display section capable of displaying an image, and a non-display area located around the display section and incapable of displaying an image; and transparent plates each disposed nearer to the viewer than the display section of a corresponding display device and covering the display section and the non-display area of the corresponding display device,
wherein adjacent transparent plates are disposed in contact with each other, and
wherein each transparent plate has:
a light entrance-side deflection portion for outwardly bending a traveling direction of at least part of light that has exited the display section, said light entrance-side deflection portion being provided at least in an area of a peripheral part of a display device-side surface, the area facing the display section when viewed in the normal direction of a display surface of the display section; and
a light exit-side deflection portion for inwardly bending a traveling direction of at least part of light that has exited the display section and passed through the transparent plate, said light exit-side deflection portion being provided at least in an area of a peripheral part of a viewer-side surface, the area facing the non-display area when viewed in the normal direction of the display surface of the display section.

In the second array-type display apparatus according to the present invention, the light exit-side deflection portion may have a curved surface, curved surfaces arranged in an inner-outer direction, inclined surfaces arranged in the inner-outer direction, or at least one curved surface and at least one inclined surface arranged in the inner-outer direction,
wherein the outer side of the light exit-side deflection portion may be located nearer to the display device than the inner side thereof in the thickness direction of the transparent plate, and an angle formed between a tangent plane of a curved surface at a point on the light exit-side deflection portion and a plane parallel to the display surface of the display section or an angle formed between an inclined surface at a point on the light exit-side deflection portion and a plane parallel to the display surface of the display section may increase as the point moves outward in the inner-outer direction, and
wherein at least part of light that exits the light exit-side deflection portion may travel in a direction perpendicular to the display surface of the display section.

In the first or second array-type display apparatus according to the present invention, the light entrance-side deflection portion may have a curved surface, curved surfaces arranged in an inner-outer direction, inclined surfaces arranged in the inner-outer direction, or at least one curved surface and at least one inclined surface arranged in the inner-outer direction, and
wherein the outer side of the light entrance-side deflection portion may be located nearer to the display device than the inner side thereof in the thickness direction of the transparent plate, and an angle formed between a tangent plane of a curved surface at a point on the light entrance-side deflection portion and a plane parallel to the display surface of the display section or an angle formed between an inclined surface at a point on the light entrance-side deflection portion and a plane parallel to the display surface of the display section may increase as the point moves outward in the inner-outer direction.

In the first or second array-type display apparatus according to the present invention, in each display device, an image formed on the display surface by light that exits that area of the display section which faces the light entrance-side deflection portion when viewed in the normal direction of the display surface of the display section, may be reduced to W2/W1 (W1 is the width of the light exit-side deflection portion and W2 is the width of the light entrance-side deflection portion) of an image formed on the display surface by light that exits the other area of the display section.

In the first or second array-type display apparatus according to the present invention, the luminance of an image displayed on that area of the display section which faces the light entrance-side deflection portion may be W1/W2 times the luminance of an image displayed on the other area of the display section.

In the first or second array-type display apparatus according to the present invention, at least part of light that has entered the light entrance-side deflection portion in the normal direction of the display surface of the display section may pass through the transparent plate and may exit it through the light exit-side deflection portion in the normal direction of the display surface of the display section.

In the first or second array-type display apparatus according to the present invention, light that has entered the light entrance-side deflection portion at an outermost point in the normal direction of the display surface of the display section may pass through the transparent plate and may exit it at a point lying nearest to the display device, on the light exit-side deflection portion in the normal direction of the display surface of the display section.

In the first or second array-type display apparatus according to the present invention, the following relation may be satisfied in a cross-section perpendicular to a side surface of the transparent plate and to the display surface of the display section:

$$H = W \times \tan\theta$$

where H represents the distance between a point T1 and a point T3, and W represents the distance between a point T2 and the point T3, the point T1 being a point lying nearest to the display device in the thickness direction of the transparent plate, on the light exit-side deflection portion, the point T2 being a outermost point on the light entrance-side deflection portion, and the point T3 being the point of intersection between the plane passing through the point T2 and parallel to the display surface of the display section, and the straight line passing through the point T1 and perpendicular to the display surface of the display section; and $\theta$ ($0° \le \theta \le 90°$) represents the angle of the traveling direction of light in the transparent plate with respect to a plane parallel to the display surface, when the light enters the transparent plate at the point T2, passes through the transparent plate and exits it at the point T1 in the normal direction of the display surface of the display section.

The array-type display apparatus according to the present invention can significantly reduce the visibility of a non-display area between display devices and can display good images with enhanced image continuity.

BRIEF DESCRIPTION OF THE DRAWINGS

DESCRIPTION OF EMBODIMENTS embodiments of the present invention will now be described with reference to the drawings. The following figures, including FIG. 1, are schematic diagrams in which dimensions and shapes may be exaggerated for easier understanding.

The terms "plate", "sheet" and "film" are used herein in the common usage, with "plate" the thickest and "film" the thinnest. There is no significant technical difference between the terms "plate", "sheet" and "film", and therefore these terms can be used interchangeably. Numerical values for the dimensions of members or components, the names of materials, etc. as used herein are merely illustrative, and are not intended to limit the present invention.

<Conventional Array-Type Display Apparatus>

A conventional array-type display apparatus will be described first.

Figure 23:
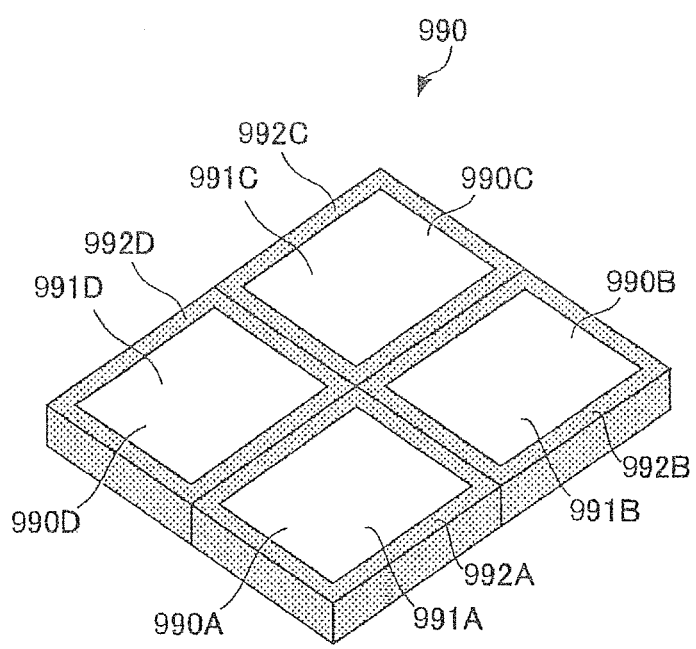
FIG. 23 is a perspective view illustrating a conventional array-type display apparatus.

FIG. 23 is a perspective view illustrating a conventional array-type display apparatus 990. The conventional array-type display apparatus 990 shown in FIG. 23 includes four display devices 990A, 990B, 990C, 990D, each having a rectangular display screen of the same size. The display devices 990A, 990B, 990C, 990D have display sections 991A, 991B, 991C, 991D, respectively, which are capable of displaying their respective images. The four display devices 990A, 990B, 990C, 990D are arranged in a 2×2 matrix such that the display sections 991A, 991B, 991C, 991D lie in a plane.

The display devices 990A to 990D may be comprised of, for example, rear projection display devices, plasma display devices, liquid crystal display devices or organic EL display devices (organic LED display devices). The number of the display devices, constituting the array-type display apparatus 990, is not limited to 4 as illustrated in FIG. 23, but may be 2, 6, 8 or other number.

Figure 24:
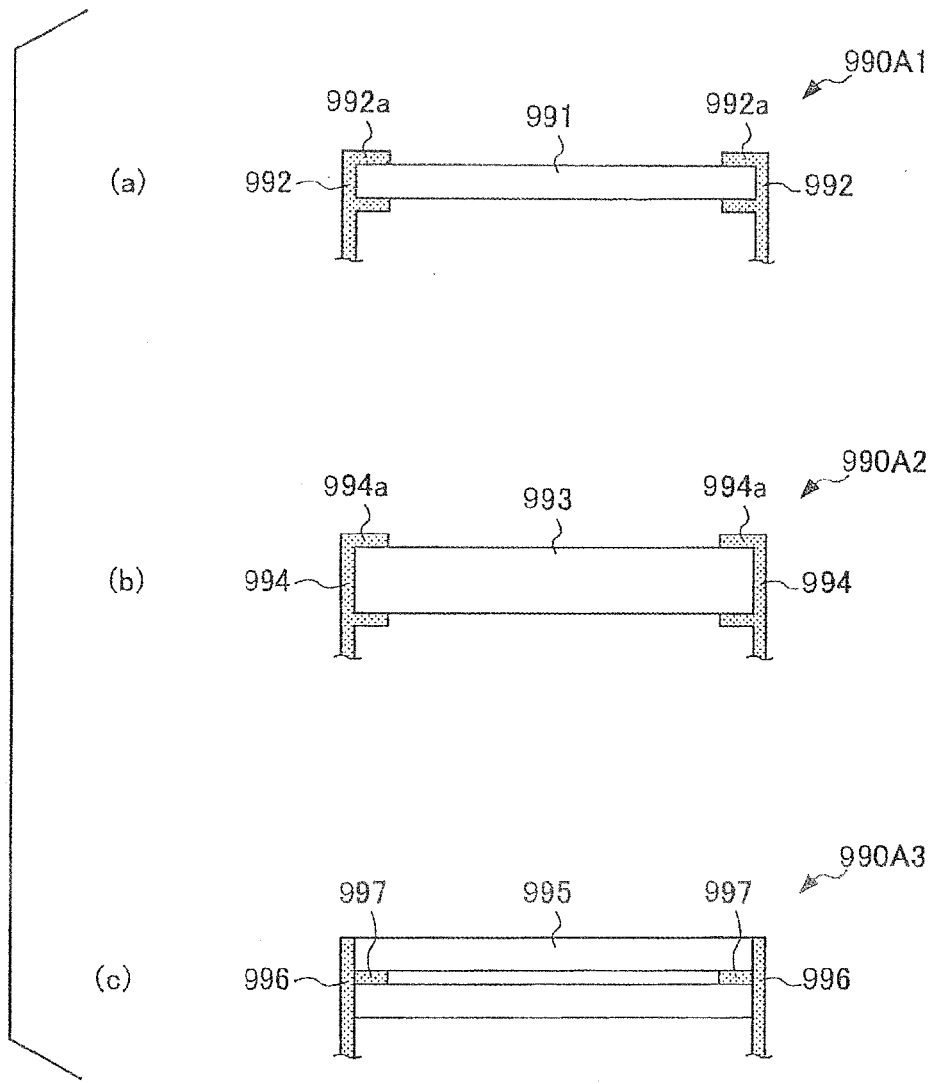
FIG. 24 shows diagrams illustrating examples of the construction of a display device for use in the conventional array-type display apparatus.

FIG. 24 shows diagrams illustrating examples of the construction of a display device 990A (990A1 to 990A3) for use in the conventional array-type display apparatus 990. FIG. 24 shows only the display device 990A (990A1 to 990A3) as a representative of the four display devices, and shows part of the display device 990A (990A1 to 990A3) in a cross-section parallel to the normal direction of the display surface (display section 991A).

FIG. 24(*a*) illustrates a case where the constituent display device is a rear projection display device; FIG. 24(*b*) illustrates a case where the constituent display device is a plasma display device, a liquid crystal display device, an organic EL display device (an organic LED display device), or the like; and FIG. 24(*c*) illustrates a case where the constituent display device is a plasma display device, a liquid crystal display device, an organic EL display device (an organic LED display device), or the like, but has a different construction from the display device of FIG. 24(*b*).

As shown in FIG. 24(*a*), the display device 990A1, which is a rear projection display device, includes a frame structure 992 for holding a rear projection screen 991. A peripheral portion of the viewer-side surface of the rear projection screen 991 is covered with the viewer-side frame member 992a of the frame structure 992, and therefore the peripheral area is a non-display area (joint portion) incapable of displaying images.

As shown in FIG. 24(b), the display device 990A2, which is a plasma display device, a liquid crystal display device, an organic EL display device, or the like, includes a frame structure 994 for holding a display panel 993. A peripheral portion of the viewer-side surface of the display panel 993 is covered with the viewer-side frame member 994a of the frame structure 994, and therefore the peripheral area is a non-display area (joint portion) incapable of displaying images.

As shown in FIG. 24(c), the display device 990A3, which is a plasma display device, a liquid crystal display device, an organic EL display device, or the like, includes a holding member 996 for holding a display panel 995. In order to reduce the width of the holding member 996, the holding member 996 is attached to the end surface of the display panel 995. However, the display panel 995 needs the provision of a peripheral area 997 where an electrode section, a wiring section, etc. are provided. The peripheral area 997 is a non-display area.

Thus, as shown in FIG. 23, the non-display areas 992A to 992D, incapable of displaying images, exist around the display sections 991A to 991D of the display devices 990A to 990D.

When an image is displayed on the conventional array-type display apparatus 990, the non-display areas 992A to 992D between the display devices 990A to 990D are perceived as dark joint lines. This significantly reduces the continuity and the visibility of the image, thus lowering the quality of the image.

The present invention is intended to solve the problem and provide an array-type display apparatus which can display a continuous image with good visibility.

First Embodiment

Figure 1:
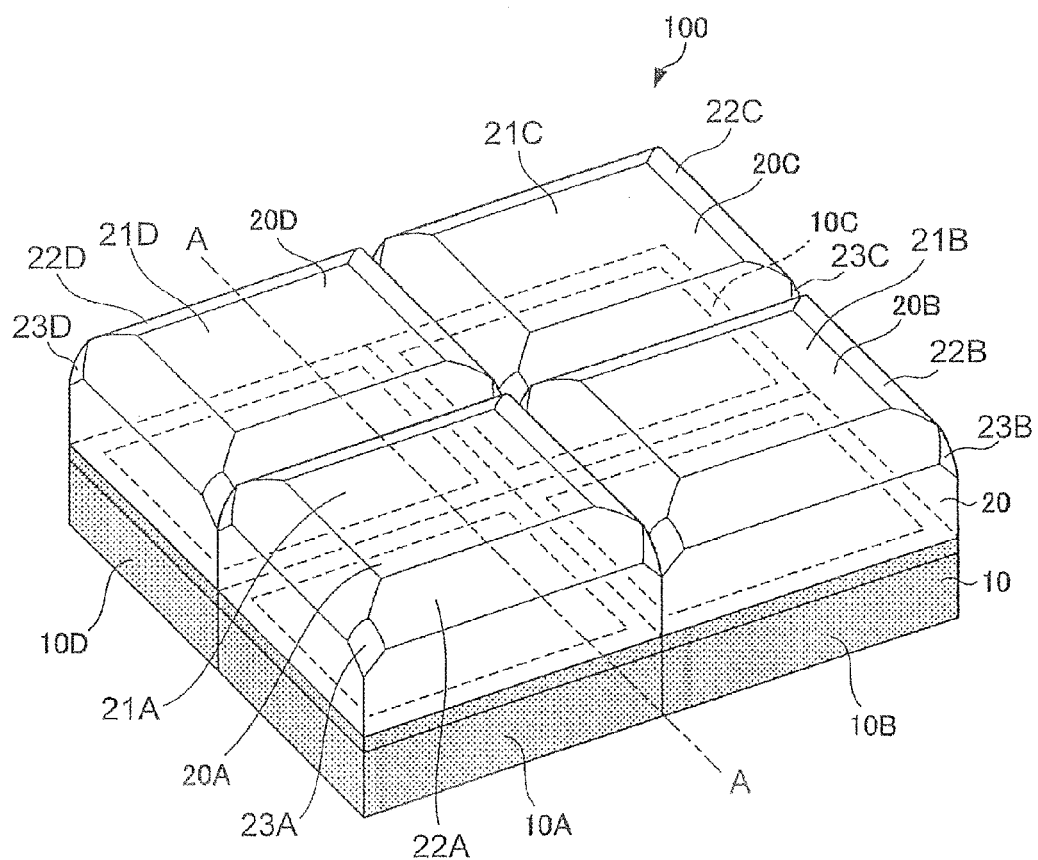
FIG. 1 is a perspective view illustrating an array-type display apparatus according to a first embodiment of the present invention.

FIG. 1 is a perspective view of an array-type display apparatus 100 according to a first embodiment of the present invention. FIGS. 2(a) through 2(d) are diagrams illustrating display devices 10 and transparent plates 20, provided in the array-type display apparatus shown in FIG. 1. In particular, FIG. 2(a) shows the array-type display apparatus 100 in a cross-section taken along the line A-A of FIG. 1 and parallel to the thickness direction of the array-type display apparatus 100. FIG. 2(b) is a plan view of a display device 10A as viewed from the viewer. FIG. 2(c) is a plan view of a transparent plate 20A as viewed from the viewer, while FIG. 2(d) is a plan view of the transparent plate 20A as viewed from the display device 10A. For easier understanding, FIGS. 2(b) through 2(d) show only the display device 10A or the transparent plate 20A as a representative.

The array-type display apparatus 100 of this embodiment includes a display device section 10 and a transparent plate section 20. The transparent plate section 20 is provided on the viewer side, i.e. on the light exit side, of the display device section 10 and, in this embodiment, is bonded to the display device section 10 via a bonding layer 30 (see FIG. 2(a) and the below-described FIG. 3) provided between the transparent plate section 20 and the display device section 10. The bonding layer 30, which bonds the transparent plate section 20 and the display device section 10 together, preferably has a high light transmittance and has the same refractive index as the transparent plate section 20 (with no substantial difference between their refractive indices), and is optically equivalent to the transparent plate section 20.

The display device section 10 is comprised of an array of display devices to display images.

Figure 2:
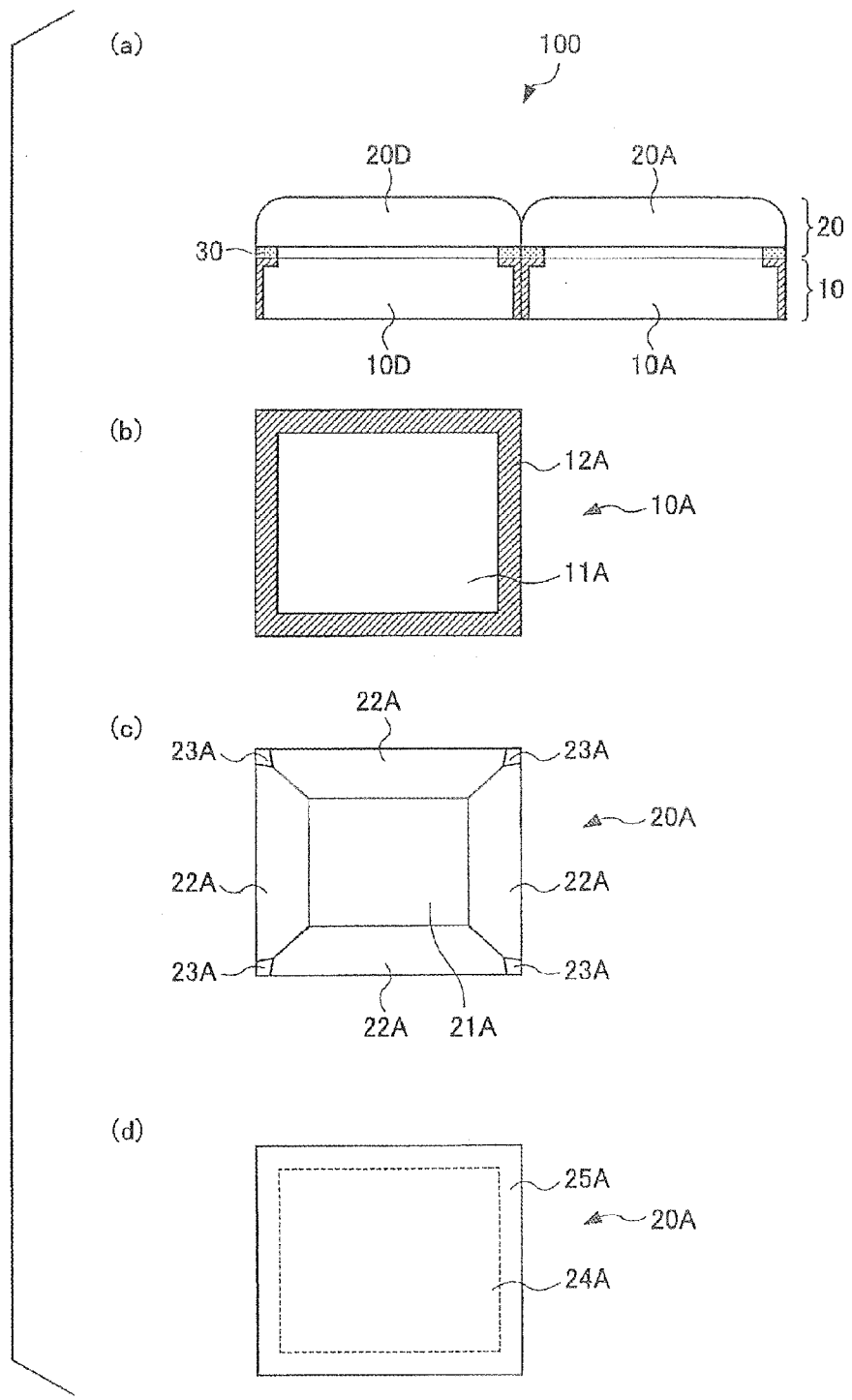
FIG. 2 shows diagrams illustrating the array-type display apparatus shown in FIG. 1.

As shown in FIGS. 1 and 2, in the display device section 10 of this embodiment, the display devices 10A to 10D are arranged adjacent to each other such that the display surfaces of display sections 11A to 11D, which are capable of displaying images, lie in a plane.

The display devices 10A to 10D are arranged in a 2×2 matrix (two in the vertical direction and two in the lateral direction when the array-type display apparatus 100 is in use). The number of the display devices, constituting the array-type display apparatus 100, is not limited to 4, but may be 2, 6, 8 or other number depending on the screen size, etc. Further, the arrangement direction of the display devices may be set arbitrarily.

As shown in FIG. 2(b), when viewed in the normal direction nd (see FIG. 3) of the display surface 11A1 of the display section 11A, the display device 10A includes the display section 11A which is capable of displaying images, and a non-display area 12A which is located around the display section 11A and which does not display images. The non-display area 12A may be composed of, for example, a frame member or an electrode section.

The display section 11A of this embodiment, when viewed in the normal direction nd of the display surface 11A1 of the display section 11A, has a generally-rectangular shape, and the non-display area 12A is located around and adjacent to the display section 11A. The other display devices 10B to 10D have the same construction.

The display devices 10A to 10D may be plasma display devices, liquid crystal display devices, organic EL display devices (organic LED display devices), or the like, or may be rear projection display devices.

The transparent plate section 20 is comprised of a transparent generally-flat plate-like member disposed on the viewer side of the display screen of the display device section 10. As shown in FIG. 1, the transparent plate section 20 of this embodiment is comprised of an array of transparent plates 20A to 20D arranged adjacent to each other in a 2×2 matrix (two in the vertical direction and two in the lateral direction when the array-type display apparatus 100 is in use) and has a generally-flat plate-like shape.

The transparent plates 20A, 20B, 20C, 20D are disposed in positions corresponding to the display devices 10A, 10B, 10C, 10D, respectively. The transparent plates 20A to 20D are disposed nearer to the viewer than the display sections 11A to 11D of the corresponding display devices 10A to 10D, and cover the display sections 11A to 11D and the non-display areas 12A to 12D of the display devices 10A to 10D. When viewed in the front direction (normal direction) of the screen of the array-type display apparatus 100, the sizes and shapes of the transparent plates 20A to 20D coincide with those of the corresponding display devices 10A to 10D. Further, as shown in FIG. 2(c), the transparent plates 20A to 20D are each a generally-flat plate-like member and, when viewed in the normal direction of the plate plane (the front direction of the screen of the array-type display apparatus 100), they each have a generally-rectangular shape.

The term "plate plane" of a transparent plate herein refers to a plane which coincides with the planar direction of the transparent plate when taking an overall view of the plate. The plate plane is parallel to the display surfaces of the display devices 10A to 10D and to the screen of the array-type display apparatus 100.

The transparent plates 20A to 20D are preferably formed of a transparent material having a high light transmittance.

Specific examples of the material for the transparent plates 20A to 20D include a polycarbonate (PC) resin, an acrylic resin, a styrene resin, an olefin resin, glass, ceramics, etc. The transparent plates 20A to 20D can be produced by subjecting the material to e.g. injection molding or casting.

As shown in FIG. 2(c), the transparent plate 20A has a viewer-side (light exit-side) surface consisting of a planar portion 21A, a light exit-side deflection portion 22A located around the planar portion 21A, and corner deflection portions 23A provided at the rectangular corners.

Further, as shown in FIG. 2(d), the transparent plate 20A has a display device section 10-side surface consisting of a light entrance portion 24A parallel to the planar portion 21A, and a bonding portion 25A provided in an area around the light entrance portion 24A and corresponding to the non-display area 12A.

The other transparent plates 20B to 20D have the same construction.

The light exit-side deflection portion 22A will now be described.

Figure 3:
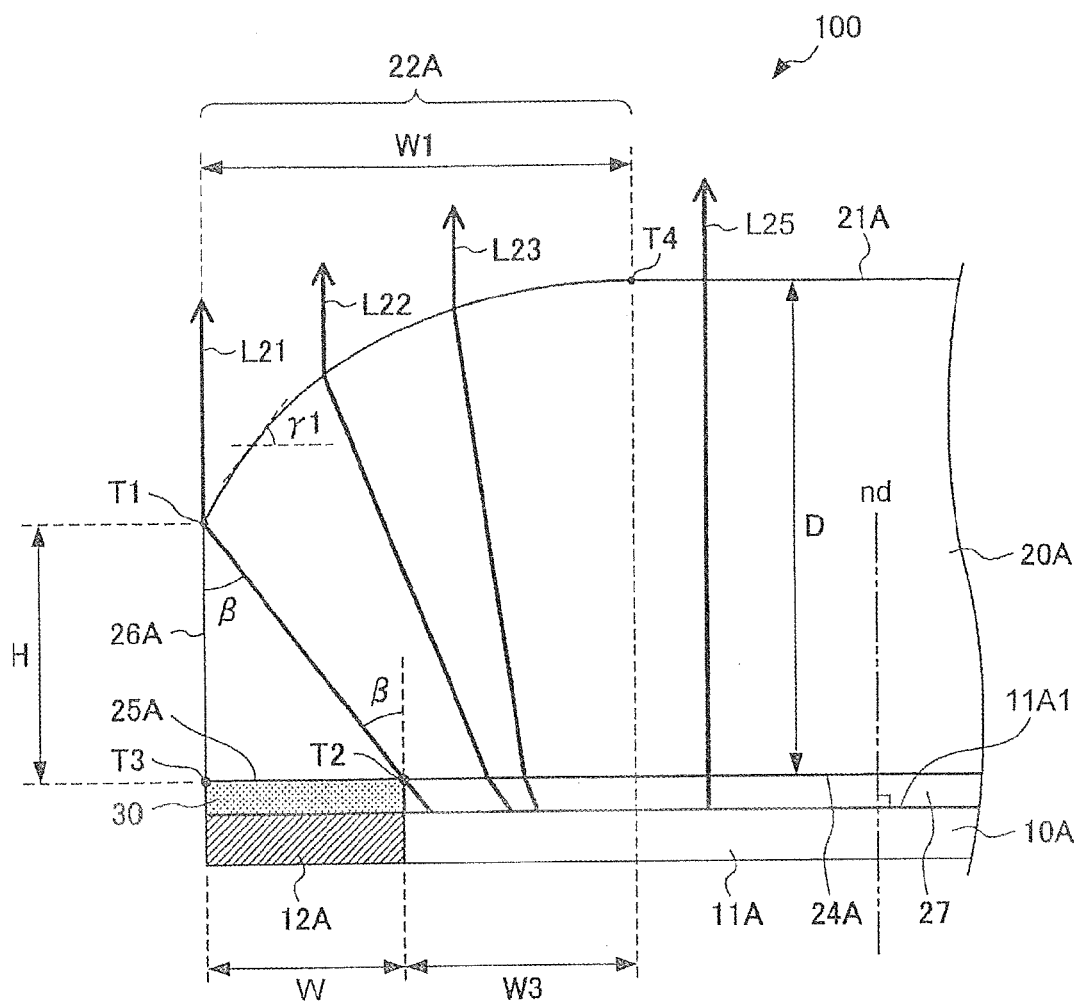
FIG. 3 is a diagram illustrating a light exit-side deflection portion shown in FIG. 1.

FIG. 3 is a diagram illustrating the light exit-side deflection portion 22A of this embodiment. FIG. 3 is an enlarged cross-sectional view of a portion of the array-type display apparatus 100 in a cross-section taken along the line A-A of FIG. 1 and parallel to the thickness direction of the array-type display apparatus 100. For easier understanding, FIG. 3 shows only the display device 10A and the transparent plate 20A and, in addition, depicts the display device 10A in a greatly simplified manner. The cross-section of FIG. 3 is perpendicular to the side surface 26A whose longitudinal direction is parallel to the longitudinal direction of the light exit-side deflection portion 22A shown in FIG. 3 and which is located adjacent to the light exit-side deflection portion 22A, and is also perpendicular to the display surface of the display section 11A. The side surface 26A is parallel to the thickness direction of the transparent plate 20A and the display device 10A, and perpendicular to the planer portion 21A and to the light entrance portion 24A.

FIG. 3 shows the light exit-side deflection portion 22A in the cross-section parallel to the thickness direction of the display device 10A and the transparent plate 20A and perpendicular to one side (side surface) of the display device 10A and one side (side surface) of the transparent plate 20A; the light exit-side deflection portion 22A has the same cross-sectional shape in the corresponding cross-sections perpendicular to the other sides. While the following description solely illustrates the display device 10A and the transparent plate 20A for easier understanding, the description holds true for the other display devices 10B to 10D and the other transparent plates 20B to 20D unless otherwise stated.

The planar portion 21A on the light exit side of the transparent plate 20A is parallel to the display surface of the display section 11A. When viewed in the front direction, the planar portion 21A has a shape similar to the shape of the display surface of the display section 11A and, in this embodiment, has a rectangular shape as shown in FIG. 2(c).

The light exit-side deflection portion 22A is provided around and adjacent to the planar portion 21A (see FIG. 1 and FIGS. 2(a) and 2(c)).

As shown in FIG. 3, the light exit-side deflection portion 22A of this embodiment is a curved surface convexed toward the viewer, and the thickness of the transparent plate 20A at a point on the light exit-side deflection portion 22A shown in FIG. 3 decreases as the point moves outward from a point T4, which lies at the boundary between the light exit-side deflection portion 22A and the planar portion 21A, toward the periphery of the transparent plate 20A. Thus, the light exit-side deflection portion 22A is nearest at the outermost point T1 to the display device 10A in the thickness direction of the transparent plate 20A.

Further, the angle γ1 formed between the tangent plane at a point on the light exit-side deflection portion 22A and a plane parallel to the display surface of the display section 11A (plane parallel to the planar portion 21A) gradually increases as the point moves from an inner position toward an outer or peripheral position on the light exit-side deflection portion 22A. The term "inner position" refers to a position nearer to the center of the transparent plate in a planar view.

The light entrance portion 24A on the light entrance side of the transparent plate 20A is parallel to the viewer-side surface, i.e. the light exit-side surface, of the display section 11A, has a rectangular shape as viewed in the front direction, and has a size and a shape corresponding to those of the display surface 11A1 of the display section 11A.

The bonding portion 25A is provided in an area which is located around and adjacent to the light entrance portion 24A and which, when viewed in the front direction of the array-type display apparatus 100, corresponds to the non-display area 12A. In the illustrated case, the bonding portion 25A, when viewed in the front direction of the array-type display apparatus 100, faces the non-display area 12A. The display device section 10-side surface of the bonding portion 25A is parallel to the viewer-side surface of the non-display area 12A.

The bonding portion 25A and the non-display area 12A are bonded together via the bonding layer 30, whereby the transparent plate 20A and the display device 10A are bonded together. As shown in FIG. 3, an air layer 27 having a predetermined thickness is formed between the light entrance portion 24A and the display section 11A.

In the cross-section shown in FIG. 3, W1 represents the width of the light exit-side deflection portion 22A, i.e. the distance between the outer end and the inner end of the light exit-side deflection portion 22A in a direction parallel to the display surface 11A1 of the display section 11A; and W represents the width of the non-display area 12A, i.e. the distance between the outer end and the inner end of the non-display area 12A in a direction parallel to the display surface 11A1 of the display section 11A (W1>W).

Further, in the cross-section shown in FIG. 3, T2 represents the outermost point on the light entrance portion 24A, and T3 represents the point of intersection between the plane, passing through the point T2 and parallel to the display surface 11A1 of the display section 11A, and the straight line passing through the point T1 and perpendicular to the display surface 11A1 of the display section 11A. In this embodiment the point T3 coincides with the intersection between the surface of the bonding portion 25A and the straight line passing through the point T1 and parallel to the thickness direction of the transparent plate 20A.

Further, H represents the distance between the point T1 and the point T3 in the thickness direction of the transparent plate 20A, and D represents the thickness of the transparent plate 20A (the distance between the planar portion 21A and the light entrance portion 24A in the thickness direction).

As shown in FIG. 3, light L25, exiting the display section 11A, for example at the center, in the normal direction nd (front direction) of the display surface 11A1, enters the light entrance portion 24A and passes through the transparent plate 20A, and exits the planar portion 21A in the normal direction nd.

On the other hand, lights L21 to L23, which have exited a peripheral end area of the display section 11A in a direction inclined outwardly, i.e. toward the non-display area 12A, with respect to the normal direction nd, enter the light entrance portion 24A and pass through the transparent plate 20A, and reach the light exit-side deflection portion 22A. The lights L21 to L23 are deflected at the interface between the light exit-side deflection portion 22A and air, and bent inwardly (toward the display section 11A). More specifically, the lights L21 to L23 are bent inwardly such that the angle of the traveling direction of each light with respect to the normal direction nd of the display surface 11A1 of the display section 11A becomes smaller. In the illustrated case, the bent lights L21 to L23 exit the light exit-side deflection portion 22A in the normal direction nd of the display surface 11A1 of the display section 11A. As described above, the angle γ1 (see FIG. 3) at a point on the light exit-side deflection portion 22A increases as the point moves outward. Therefore, the inward deflection of light, exiting the light exit-side deflection portion 22A in the normal direction nd of the display surface 11A1, is larger as the light exits at an outer point (nearer to the point T1) on the light exit-side deflection portion 22A.

Accordingly, when the display device 10A is viewed in the normal direction nd of the viewer-side display surface 11A1, the lights L21 to L23, which have exited the peripheral end area of the display section 11A and entered the light exit-side deflection portion 22A and have been bent inwardly such that the angle of the traveling direction of each light with respect to the normal direction nd of the display surface 11A1 becomes smaller, exit that area of the transparent plate 20A which faces the non-display area 12A. Therefore, the viewer perceives an image being displayed over the entire area of the transparent plate 20A, without perceiving the non-display area 12A. Further, an image displayed on the light exit-side deflection portion 22A, especially on its peripheral part, is a magnified image from light that has exited a peripheral part, near the non-display area 12A, of the display section 11A. The transparent plate 20A thus makes it possible to significantly reduce the visibility of the non-display area and enhance image continuity.

As will be appreciated from the foregoing, an image as viewed through the transparent plate 20A is perceived as an image which is continuous over the entire area of the viewer-side surface of the transparent plate 20A and as a good image without a joint portion deriving from the non-display area 12A.

The shape of the light exit-side deflection portion 22A of this embodiment will now be described in greater detail.

Figure 4:
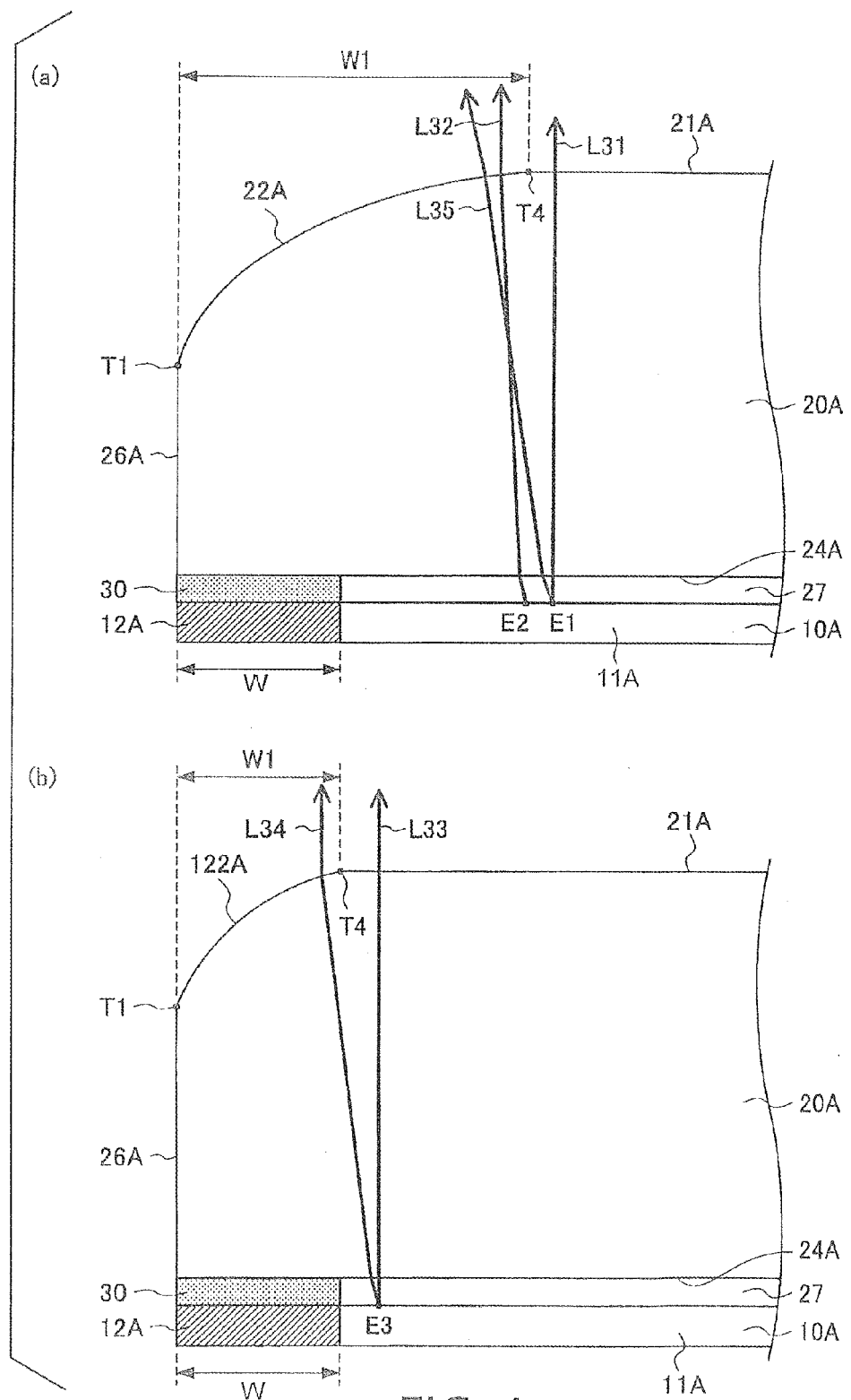
FIG. 4 shows diagrams illustrating the action of the light exit-side deflection portion shown in FIG. 1.

FIG. 4 shows diagrams illustrating the action of the light exit-side deflection portion 22A of this embodiment. FIG. 4(a) shows the light exit-side deflection portion 22A of this embodiment, and FIG. 4(b) shows a light exit-side deflection portion 122A having a width W1 equal to the width W of the non-display area. FIG. 4 shows the same cross-section as the cross-section shown in the above-described FIG. 3.

As shown in FIG. 4(b), in the case of the light exit-side deflection portion 122A having a width W1 equal to the width W of the non-display area, light L33, exiting a point E3 on that area of the display section 11A which, as viewed in the normal direction nd of the display surface 11A1, corresponds to the boundary area between the light exit-side deflection portion 122A and the planar portion 21A, and exiting in the normal direction nd of the display surface 11A1 of the display section 11A, passes through the light entrance portion 24A and the transparent plate 20A, and exits the planar portion 21A in the normal direction nd of the display surface 11A1. Light L34, also exiting the point E3 but in a direction inclined outwardly with respect to the normal direction nd, enters the light exit-side deflection portion 122A, where the light is deflected. The light L34 then exits the light exit-side deflection portion 122A in the normal direction nd of the display surface 11A1.

The lights L33 and L34 exit the same point E3, and therefore are to display the same image. Thus, the same two images are displayed in the vicinity of the boundary between the light exit-side deflection portion 122A and the planar portion 21A and are viewed as a double image.

On the other hand, in the case of the light exit-side deflection portion 22A of this embodiment in which the width W1 is set larger than the width W of the non-display area 12A, the angle γ1 formed between the tangent plane at a point on the light exit-side deflection portion 22A and a plane parallel to the planar portion 21A can be made very small in the vicinity of point T4 which lies at the boundary between the light exit-side deflection portion 22A and the planar portion 21A and, in addition, the angle γ1 continuously increases as the point on the light exit-side deflection portion 22A moves outward. Thus, in this embodiment, the light exit-side deflection portion 22A and the planar portion 21A are connected smoothly without an inflection point.

In such a transparent plate 20A of this embodiment, as shown in FIG. 4(a), light L31 exiting the planar portion 21A at a position near the point T4 in the normal direction nd of the display surface 11A1 and light L32 exiting the light exit-side deflection portion 22A at a position near the point T4 in the normal direction nd of the display surface 11A1, have exited different points E1 and E2 on the display surface 11A1 and therefore display different images. Light L35 that has exited the point E1 in an outwardly inclined direction is deflected by the light exit-side deflection portion 22A, and exits it in a direction further slightly inclined outward with respect to the normal direction nd of the display surface 11A1. Therefore, the light L35 will be invisible to a viewer who is watching the display in the normal direction nd.

The transparent plate 20A of this embodiment can therefore significantly reduce a double image which, as described above with reference to FIG. 4(b), can occur in the vicinity of the boundary between the light exit-side deflection portion 22A and the planar portion 21A.

In order for the transparent plate 20A to achieve the double image-reducing effect, the width W1 and the width W preferably satisfy the following relation: W1>W and 2×W≤W1. When the difference between the width W1 and the width W is small, the width W3 (see FIG. 3, W3=W1−W), i.e. the width of the area without an overlap between the width W1 and the width W, is narrow. An image on the area is magnified when displayed on the light exit-side deflection portion 22A. When the width W3 is small, an image at a high magnification ratio is displayed on the light exit-side deflection portion 22A, resulting in reduced image continuity with an adjacent image. It is therefore preferred that the relation "2×W≤W1" be satisfied.

Further, the width W1 and the width W preferably satisfy the following relation: W1≤4×W One reason for this is that if the width W1 is made large and the cross-sectional shape of the light exit-side deflection portion 22A, shown in FIG. 3, is made a circular shape which is easy to produce, the transparent plate 20A will have the following disadvantages: an increase in the thickness D of the transparent plate 20A; an increase in the weight of the transparent plate 20A; and an increase in the load on the holding of the transparent plate section 20.

Another reason is that if the transparent plate 20A is designed such that the width W1 is made large without increasing the thickness D of the transparent plate 20A, the angle γ1 formed between the tangent plane at a point on the light exit-side deflection portion 22A and a plane parallel to the display surface of the display section 11A will be very small as approximately zero in the vicinity of point T4 which lies at the boundary between the light exit-side deflection portion 22A and the planar portion 21A. Thus, the light exit-side deflection portion 22A, in an area in the vicinity of the point T4, will be substantially parallel to the planar portion 21A. This may result in a lowering of the above-described optical effect achieved by the use of a large width W1. Furthermore, the use of such a transparent plate 20A involves an increased machining workload in the production of a mold or the like for producing the transparent plate 20A.

From the viewpoint of reducing the visibility of a joint portion due to the non-display area 12A and enhancing image continuity, the light exit-side deflection portion 22A is preferably located at an appropriate distance from the non-display area 12A in the thickness direction of the transparent plate 20A (the normal direction nd of the display surface 11A1 of the display section 11A).

Referring to FIG. 3, H represents the distance between the point T1 and the point T3 in the thickness direction of the transparent plate 20A (in this embodiment is equal to the distance from the point T1 to the bonding surface of the bonding portion 25A in the thickness direction), and W represents the distance between the point T2 and the point T3 (in this embodiment is equal to the width of the non-display area 12A). Further, β represents the angle of the traveling direction of light L21, which enters the transparent plate 20A at the point T2, passes through the transparent plate 20A and exits at the point T1 in the normal direction nd of the display surface 11A1 of the display section 11A, in the transparent plate 20A with respect to the normal direction nd of the display surface 11A1 of the display section 11A.

The distances H, W and the angle β satisfy the following relation: $\tan \beta = W/H$. It is therefore preferred that the following formula (1) be satisfied in order to allow light to exit the light exit-side deflection portion 22A of the transparent plate 20A in the normal direction nd of the display surface 11A1:

$$H \geq W/\tan \beta \tag{1}$$

If the distance H does not satisfy the formula (1), i.e. if $H < W/\tan \beta$ (β is constant), light that enters the transparent plate 20A at the point T2 and travels in the transparent plate 20A obliquely outward toward the non-display area 12A at the angle β with respect to the normal direction nd of the display surface 11A1 of the display section 11A, will exit the light exit-side deflection portion 22A at a point on the inner side of the point T1.

Accordingly, display light will not exit at the outermost point T1 in the normal direction nd of the display surface 11A1 of the display section 11A, and the non-display area 12A will be perceived by the viewer as a joint portion where no image is displayed. This reduces the continuity and visibility of an image displayed on the array-type display apparatus, thereby lowering the quality of the image. It is therefore preferred that the distance H satisfy the relation "$H \geq W/\tan \beta$".

In the cross-section shown in FIG. 3, as the distance H increases from $W/\tan \beta$, an exit point on the display section 11A of light, which is to enter the light exit-side deflection portion 22A of the transparent plate 20A and exit it in the normal direction nd of the display surface 11A1, moves inward (toward the center of the display screen) from an outer or peripheral position (nearer to the non-display area 12A) on the display section 11A. Therefore, if the H value is too much larger than $W/\tan \beta$, there will be a large displacement between an image displayed by light that exits the light exit-side deflection portion 22A in a direction perpendicular to the display surface and an image displayed by light that exits the planar portion 21A, located adjacent to the light exit-side deflection portion 22A, in the normal direction nd of the display surface 11A1. This reduces the continuity of an image displayed on the screen of the array-type display apparatus 100.

Therefore, from the viewpoint of displaying good images, the distance H, while satisfying the formula (1), is preferably not too large. In particular, the distance H preferably satisfies the following formula (2):

$$H \leq 1.1 \times W/\tan \beta \tag{2}$$

If the distance H does not satisfy the formula (2), i.e. if $H > 1.1 \times W/\tan \beta$, an image displayed by light that exits the light exit-side deflection portion 22A in a direction perpendicular to the display surface differs from an image displayed on that area of the display section 11A which lies adjacent to the non-display area 12A, as described above. This reduces image continuity.

As will be appreciated from the foregoing, from the viewpoint of significantly reducing the visibility of the non-display areas 12A to 12D between the display devices 10A to 10D and providing the array-type display apparatus 100 capable of displaying good images with high image continuity, the distance H preferably satisfies the following two formulae:

$$H \geq W/\tan \beta \tag{1}$$

$$H \leq 1.1 \times W/\tan \beta \tag{2}$$

The array-type display apparatus 100 of this embodiment, which satisfies such conditions, can display an image which is continuous over the entire area of the viewer-side surfaces of the transparent plates 20A to 20D, while preventing display of a joint portion due to the non-display areas 12A to 12D between the display devices 10A to 10D.

The corner deflection portions 23A will now be described.

Figure 5:
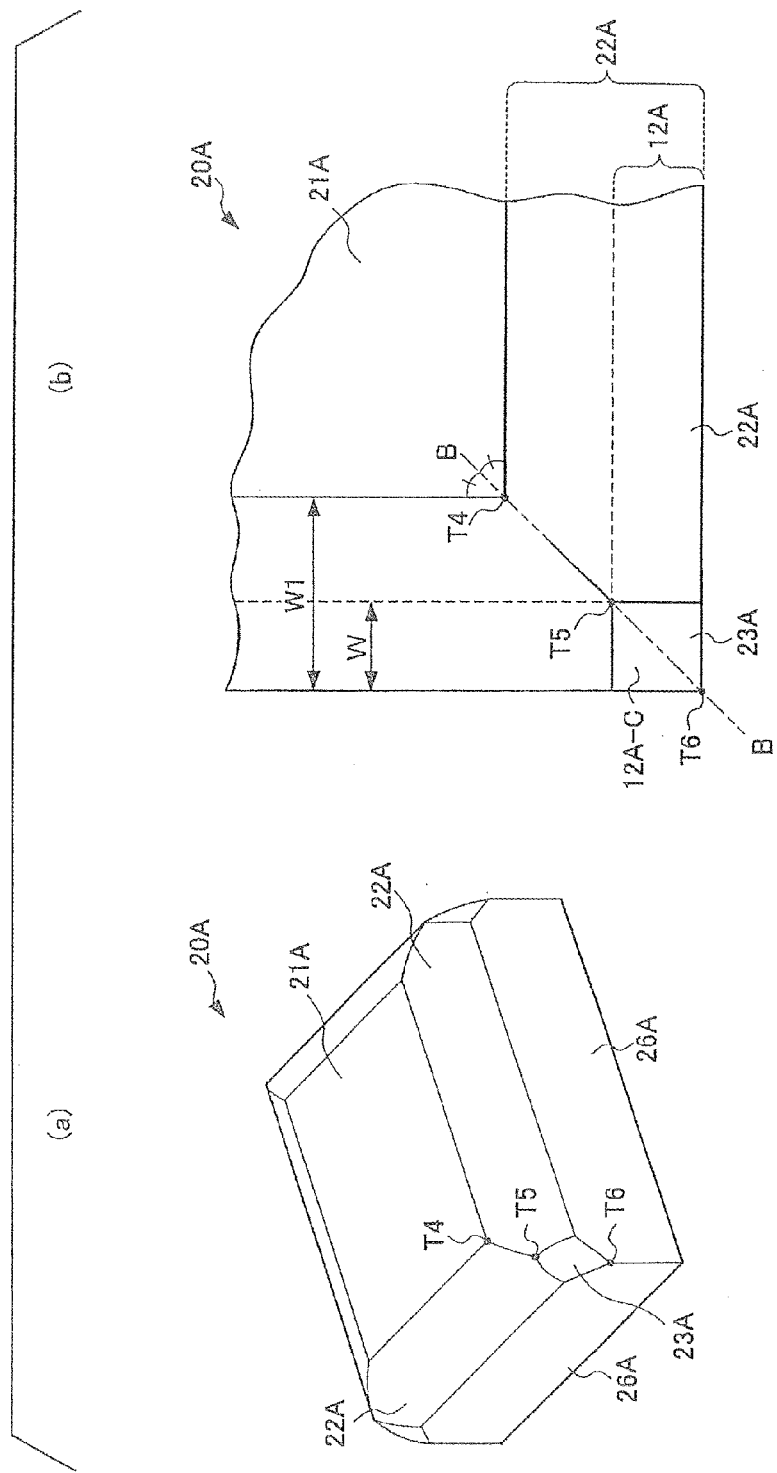
FIG. 5 shows diagrams illustrating a corner deflection portion shown in FIG. 1.
Figure 6:
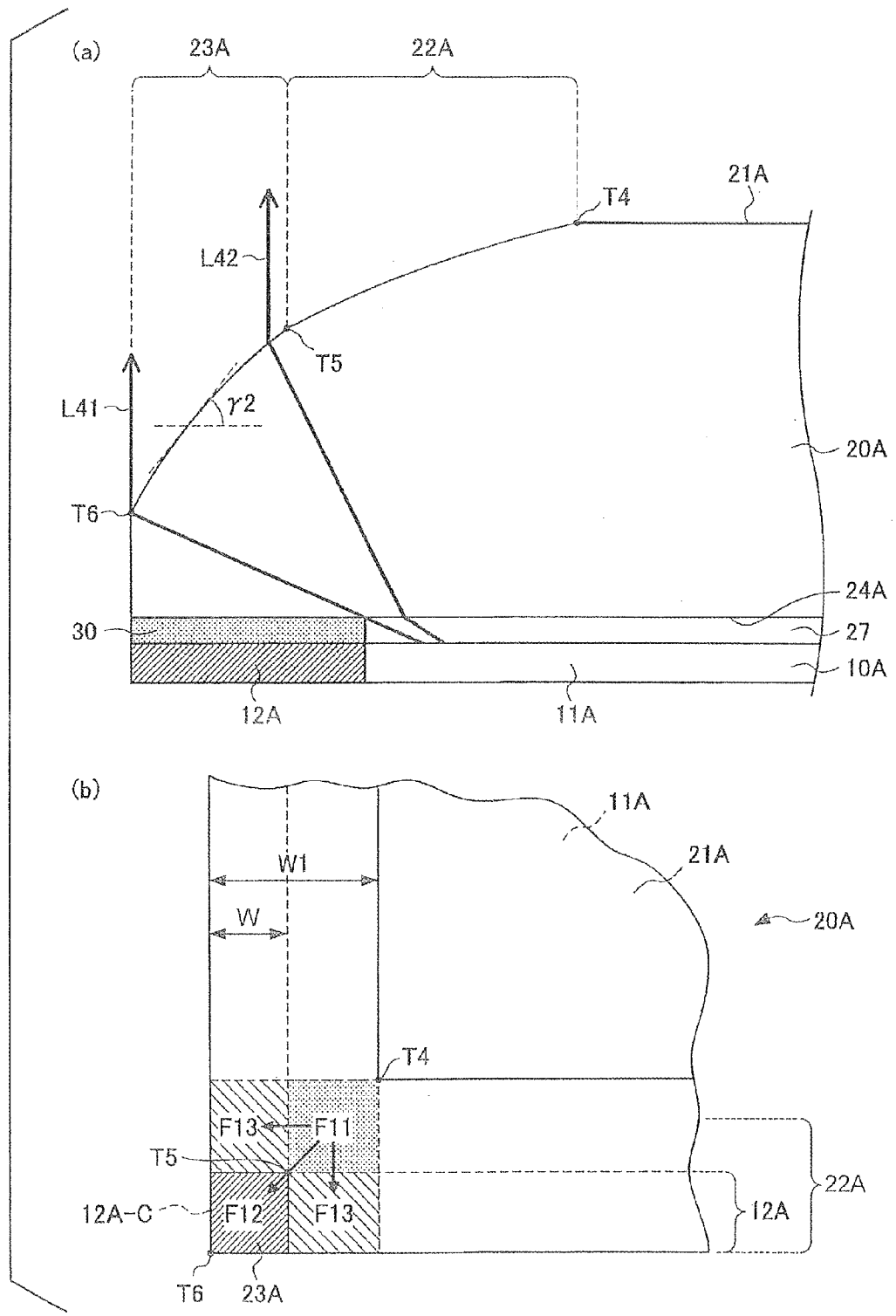
FIG. 6 shows diagrams illustrating the corner deflection portion shown in FIG. 1.

FIGS. 5 and 6 show diagrams illustrating the corner deflection portion 23A of this embodiment.

FIG. 5(a) is a perspective view of the corner deflection portion 23A, and FIG. 5(b) shows the corner of the transparent plate 20A as viewed in the normal direction nd of the display surface 11A1 of the display section 11A. FIG. 6(a) is a cross-sectional view of the corner deflection portion 23A in a cross-section parallel to the two-dot chain line B-B of FIG. 5(b) and parallel to the thickness direction of the transparent plate 20A, and FIG. 6(b) shows the corner of the transparent plate 20A as viewed in the normal direction nd of the display surface 11A1 of the display section 11A.

As shown in the above-described FIGS. 1 and 2, the corner deflection portions 23A are provided at the corners of the light exit-side surface of the transparent plate 20A.

As with the light exit-side deflection portion 22A, the corner deflection portions 23A are curved surfaces convexed toward the viewer and, as shown in FIG. 6, the angle γ2 formed between the tangent at a point on the corner deflection portion 23A and the display surface 11A1 of the display section 11A gradually increases as the point moves toward the point T6.

As shown in FIGS. 5 and 6, the innermost point T5 on the corner deflection portion 23A lies on the outer side of the innermost point T4 on the light exit-side deflection portion 22A and lies nearer than the point T4 to the display device 10A in the thickness direction of the transparent plate 20A.

When viewed in the normal direction nd of the display surface 11A1 of the display device 10A, the outermost point T6 on the corner deflection portion 23A lies nearer to the display device 10A than the outermost point T1 on the light exit-side deflection portion 22A.

As shown in FIG. 5(b), when viewed in the normal direction nd of the display surface 11A1, the corner deflection portion 23A is formed in an area corresponding to the corner area 12A-C of the non-display area 12A. In particular, the corner deflection portion 23A is formed in an area facing the corner area of the non-display area 12A.

The corner deflection portion 23A and the light exit-side deflection portion 22A are connected smoothly at the boundary portion, though the corner deflection portion 23A may be inclined with respect to the light exit-side deflection portion 22A. The angle γ2 at the point T6 on the corner deflection portion 23A is larger than the angle γ1 at the point T1 on the light exit-side deflection portion 22A.

With the corner deflection portion 23A, having such a shape, formed in the transparent plate 20A, lights L41, L42, which have exited an area of the display section 11A in the vicinity of the corner, enter the light entrance portion 24, pass through the transparent plate 20A and reach the corner deflection portion 23A. When the lights L41, L42 then exit the corner deflection portion 23A, at least part of the lights is deflected and bent inwardly such that the angle of the traveling direction with respect to the normal direction nd of the display surface 11A1 of the display section 11A becomes smaller. The provision of the corner deflection portion 23A can therefore enhance image continuity at the corner area of the transparent plate 20A and, in addition, can prevent display of a point-like joint portion, a double image, etc. which are likely to be displayed on the corner area.

Figure 7:
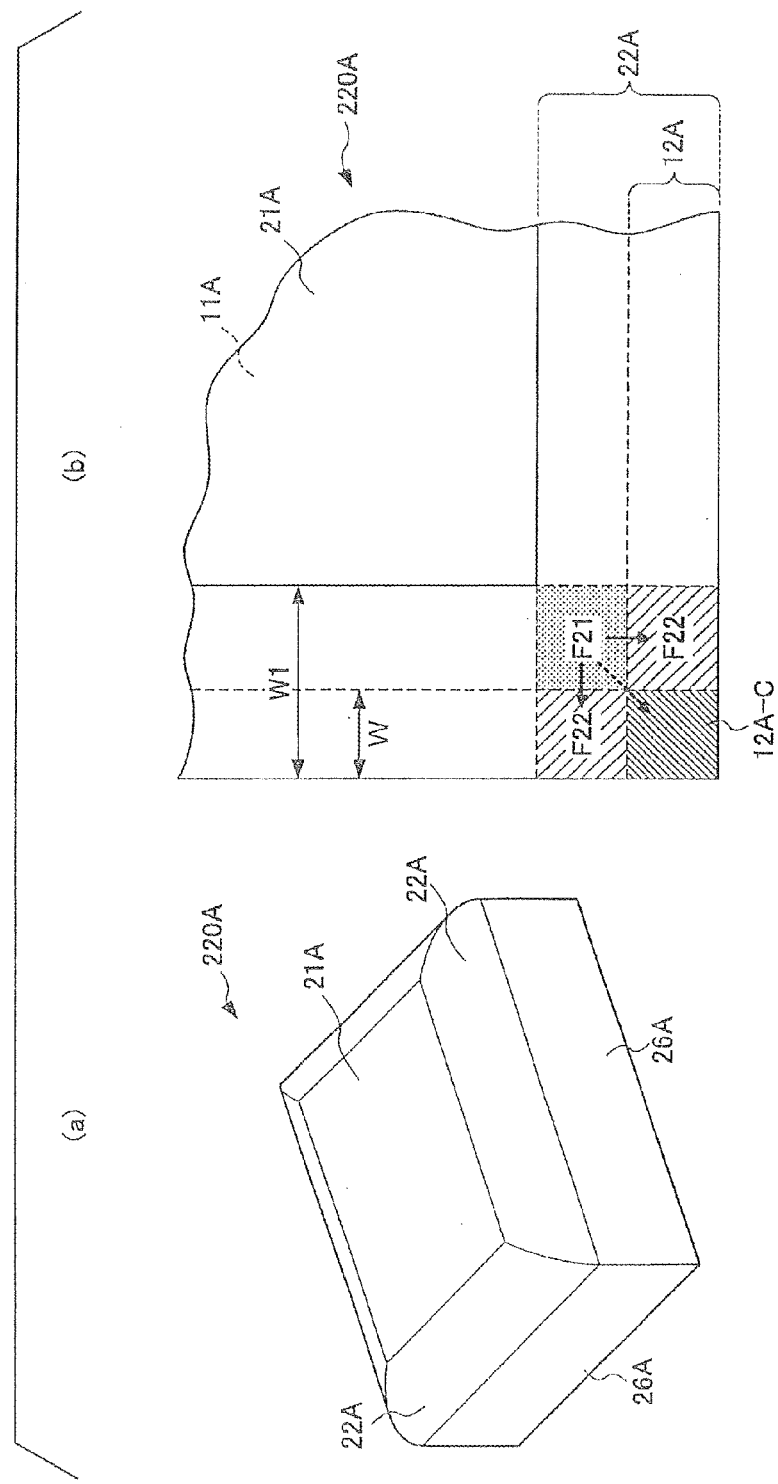
FIG. 7 shows diagrams illustrating a corner portion of a transparent plate having no corner deflection portion.
Figure 8:
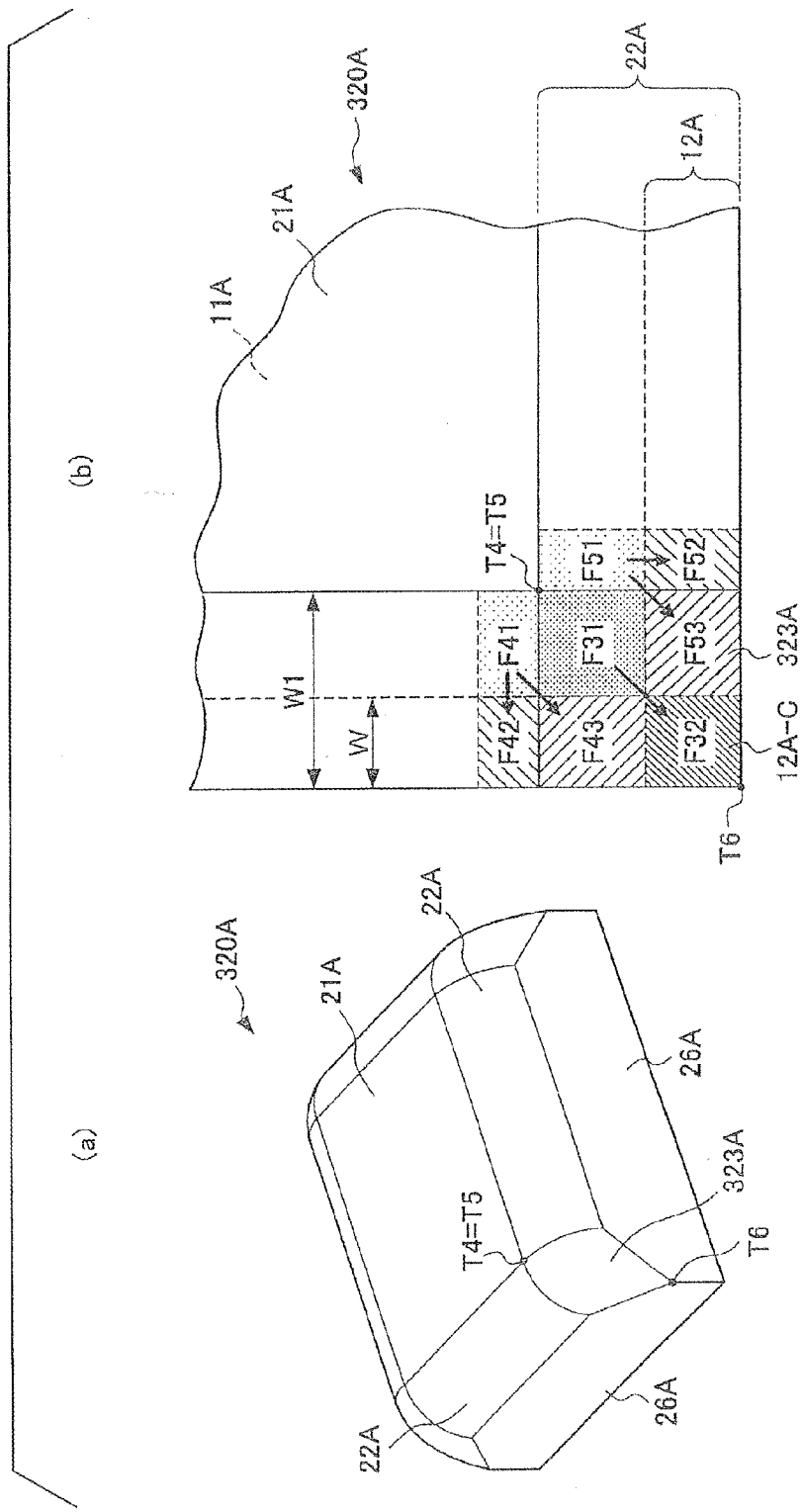
FIG. 8 shows diagrams illustrating a corner portion of a transparent plate having corner deflection portions, with the innermost point T5 on each deflection portion lying in the same position as an innermost point on a light exit-side deflection portion.

FIG. 7 shows diagrams illustrating a corner portion of a transparent plate 220A having no corner deflection portion, and FIG. 8 shows diagrams illustrating a corner portion of a transparent plate 320A having corner deflection portions 323A, in which the innermost point T5 on each deflection portion lies in the same position as the innermost point T4 on the light exit-side deflection portion 22A.

FIGS. 7(a) and 8(a) are perspective views of the corner portions of the transparent plates 220A, 320A, and FIGS. 7(b) and 8(b) are diagrams showing the corner portions of the transparent plates 220A, 320A as viewed in the normal direction nd of the display surface 11A1.

In the case of the transparent plate 220A having no corner deflection portion, as shown in FIG. 7(b), light that has exited a corner area F21 of the display section 11A enters the transparent plate 220A and travels in the direction of the arrow shown in the figure, and exits an area F22 of the light exit-side deflection portion 22A in the normal direction nd of the display surface 11A1 while the light is deflected by the light exit-side deflection portion 22A. On the other hand, light that exits the area F21 and travels toward an area corresponding to the area 12A-C (in the direction of the dashed arrow shown in FIG. 7(b)) will not be deflected by the light exit-side deflection portion 22A to the normal direction nd of the display surface 11A1. Thus, light little exits the light exit-side area of the transparent plate 220A (shown as shaded area in FIG. 7(b)), corresponding to the corner area 12A-C of the non-display area 12A, in the normal direction nd of the display surface 11A1. Therefore, when viewed in the normal direction nd of the display surface 11A1, the area corresponding to the corner area 12A-C is perceived as a dark portion (point-like joint portion), which lowers image continuity.

In the case of the transparent plate 320A in which, as shown in FIG. 8, the innermost point T5 on each corner deflection portion 323A coincides with the innermost point T4 on the light exit-side deflection portion 22A, light that has exited a corner area F31 of the display section 11A exits an area (area F32) of the corner deflection portion 323A, corresponding to the corner area 12A-C of the non-display area 12A, in the normal direction nd of the display surface 11A1. This can avoid display of a dark corner portion. On the other hand, light that has exited an area F41 or F51, lying adjacent to the corner area F31 of the display section 11A, partly exits an area F42 or F52 of the light exit-side deflection portion 22A in the normal direction nd of the display surface 11A1, and partly exits an area F43 or F53, lying adjacent to the area 32, of the corner deflection portion 323A in the normal direction nd of the display surface 11A1, as shown in FIG. 8(b).

Accordingly, the light that exits the area F42 or F52 in the normal direction nd of the display surface 11A1 displays the same image as the light that exits the area F43 or F53 in the normal direction nd of the display surface 11A1. Thus, a double image is displayed on the areas F42, F43 or on the areas F52, F53.

According to this embodiment, on the other hand, light that has exited a corner area F11 of the display section 11A partly exits the corner deflection portion 23A (area F12), formed in an area corresponding to the corner area 12A-C of the non-display area 12A, in the normal direction nd of the display surface 11A1, as shown in FIG. 6(b). This makes it possible to significantly reduce the visibility of a dark corner portion.

The light that has exited the area F11 partly exits an area F13 of the light exit-side deflection portion 22A in the normal direction nd of the display surface 11A1. However, because the areas F12 and F13 are smaller than the above-described areas F42, F43, F52, F53 and are concentrated in the corner portion, the light is unlikely to be perceived as a double image.

The provision of the corner deflection portions 23A of this embodiment can therefore enhance image continuity, enabling an image to be displayed over the entire area, including the corners, of the transparent plate and, in addition, can significantly reduce the visibility of a double image.

As will be appreciated from the foregoing, with the provision of the transparent plate section 20 comprised of the transparent plates 20A to 20D each having the light exit-side deflection portion and the corner deflection portions, the array-type display apparatus 100 of this embodiment can significantly reduce the visibility of a joint portion, can display an image with high continuity, and can display a good image comparable to an image as displayed on a single display device.

Example Concerning the First Embodiment

An example of the array-type display apparatus 100 of this embodiment, having the following dimensions, was produced and checked for the continuity of a displayed image.

Display devices 10A to 100D: transmissive liquid crystal display devices

Screen size of the display sections 11A to 11D: diagonal screen size 50 inches (1100 mm×620 mm)

Width W of the non-display areas 12A to 12D: 4 mm

Transparent plates 20A to 20D: made of acrylic resin

Thickness D: 15 mm

Distance H: 7 mm

Light exit-side deflection portions 22A to 22D: the width W1=12 mm, the radius of curvature 13 mm Corner deflection portions 23A to 23D: the width (the distance between point T5 and point T6) 5.6 mm, the radius of curvature 15 mm An image was actually displayed on the array-type display apparatus produced, and an evaluation of the continuity of the image, etc. was made by visual observation in the front direction. As a result, the image was found to be a highly continuous one; the non-display area between the display devices was not visible. Further, no double image was observed in areas around the boundaries between the planar portion and the light exit-side deflection portion or around the boundaries between the light exit-side deflection portion and the corner deflection portions; a good image was displayed in those areas.

The evaluation results thus verify that the array-type display apparatus of this embodiment can have the advantages of: no display of a dark line or the like; high image continuity; and the capability of displaying good images without a display defect, such as a double image.

A Modification of the First Embodiment

Figure 9:
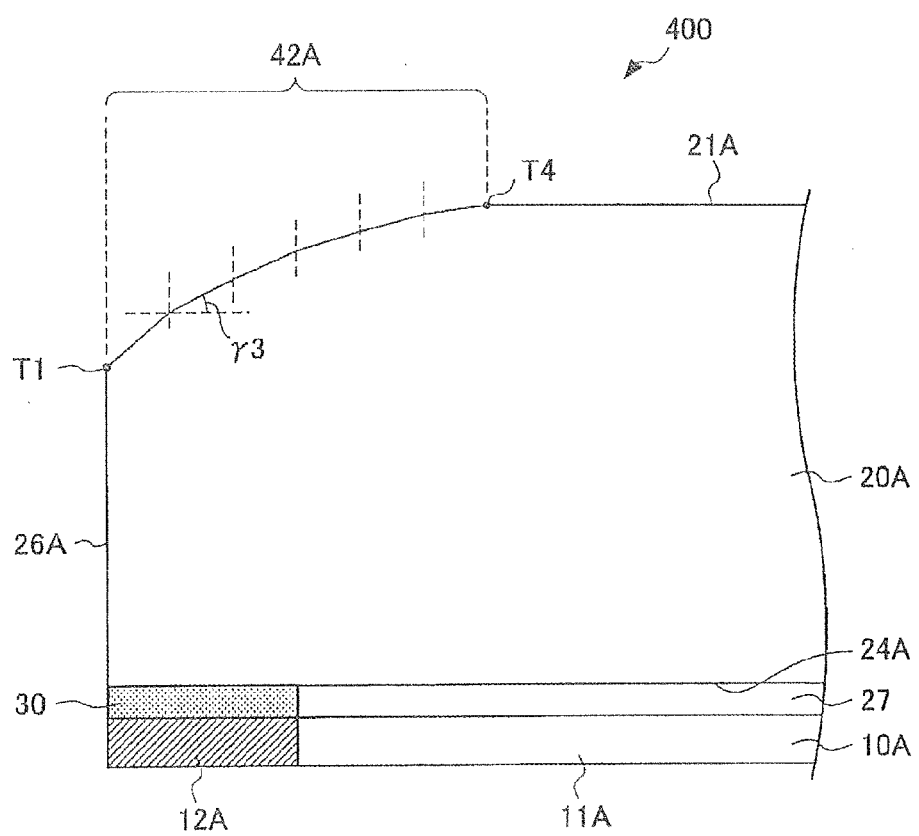
FIG. 9 is a diagram illustrating an array-type display apparatus which is a modification of the array-type display apparatus shown in FIG. 1.

FIG. 9 is a diagram illustrating an array-type display apparatus 400 which is a modification of the array-type display apparatus shown in FIG. 1. FIG. 9 shows the array-type display apparatus 400 in a cross-section corresponding to the cross-section shown in FIG. 3.

The array-type display apparatus 400 has the same shape as the array-type display apparatus 100 of the first embodiment except that the light exit-side deflection portion 42A of the transparent plate 20A is polygonally curved and consists of a number of inclined surfaces. Therefore, the same reference numerals or the same last symbols are used for those portions which perform the same function as the above-described portions of the first embodiment, and a duplicate description thereof will be omitted.

While the following description solely illustrates the display device 10A and the transparent plate 20A of the array-type display apparatus 400 for easier understanding, the description holds true for the other not-shown display devices 10B to 10D and the other not-shown transparent plates 20B to 20D.

As shown in FIG. 9, in the array-type display apparatus 400 of this embodiment, the light exit-side deflection portion 42A formed in the transparent plate 20A is polygonally curved and consists of a number of inclined surfaces (flat surfaces) arranged in the inner-outer direction. Namely, a number of inclined surfaces are arranged from an inner side to an outer side. The angle γ3 formed between each inclined surface of the light exit-side deflection portion 42A and a plane parallel to the display surface 11A1 of the display section 11A gradually increases with distance from the innermost position on the light exit-side deflection portion 42A in the width direction. From the viewpoint of enhancing image continuity and reducing a double image, the number of inclined surfaces arranged in the inner-outer direction (width direction) is preferably as large as possible.

The shape of the light exit-side deflection portion 42A, defined by the inclined surfaces, can approximate a curved surface convexed toward the viewer.

Therefore, as with the transparent plate 20A (transparent plate section 20) having the light exit-side deflection portion 22A of the above-described first embodiment, the transparent plate 20A (transparent plate section 20) having the polygonally curved light exit-side deflection portion 42A of this embodiment can also display good images with high image continuity.

Though in this embodiment the light exit-side deflection portion 42A of the transparent plate 20A consists of a number of inclined surfaces, the present invention is not limited to such a light exit-side deflection portion. For example, it is possible to use a light exit-side deflection portion consisting of a curved surface, curved surfaces arranged in the inner-outer direction, inclined surfaces arranged in the inner-outer direction, or at least one curved surface and at least one inclined surface, arranged in the inner-outer direction.

The above description of the light exit-side deflection portion 42A holds true for the corner deflection portion 23. Thus, it is possible to use a corner deflection portion consisting of a curved surface, curved surfaces arranged in the inner-outer direction, inclined surface, inclined surfaces arranged in the inner-outer direction, or at least one curved surface and at least one inclined surface, arranged in the inner-outer direction. The shape of the corner deflection portion, defined by the inclined surfaces, can approximate a curved surface convexed toward the viewer. Therefore, as with the transparent plate 20A (transparent plate section 20) provided with the corner deflection portions 23A of the above-described first embodiment, the transparent plate 20A provided with such corner deflection portions can also display good images with high image continuity.

Variations of the First Embodiment

The present invention is not limited to the first embodiment and the modification described above, but is capable of various changes and modifications within the scope of the inventive concept as expressed herein.

Figure 10:
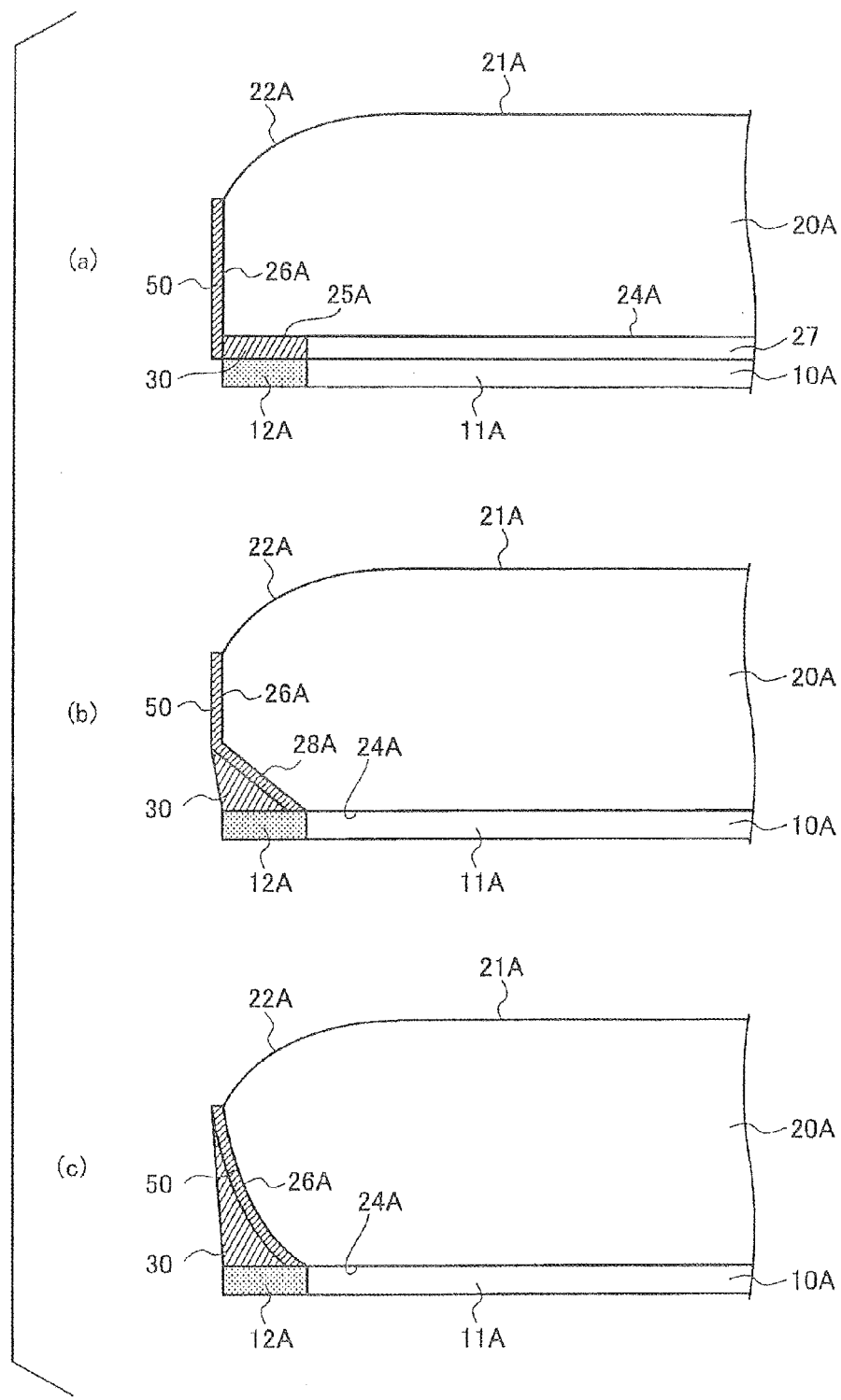
FIG. 10 shows diagrams illustrating variations of a transparent plate shown in FIG. 1.

FIG. 10 shows diagrams illustrating variations of the transparent plates 20A to 20D.

Figure 11:
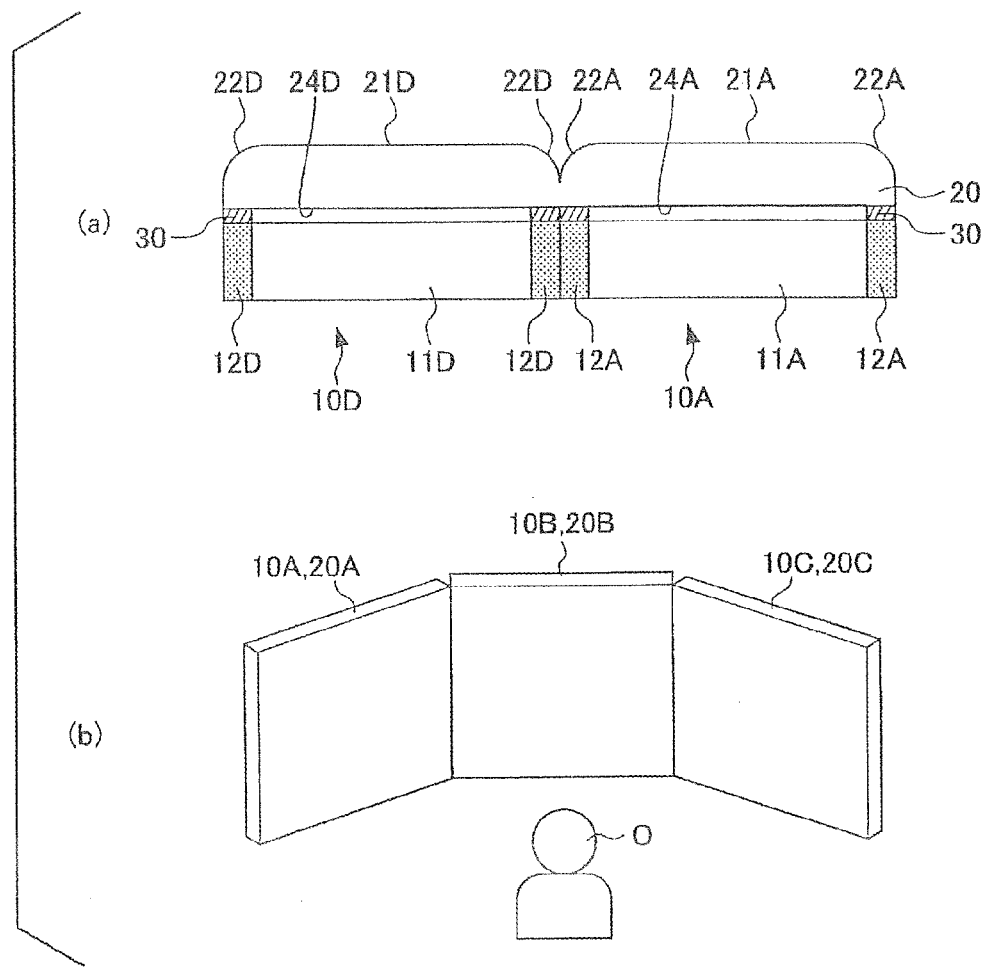
FIG. 11 shows diagrams illustrating variations of the array-type display apparatus shown in FIG. 1.

FIG. 11 shows diagrams illustrating variations of the array-type display apparatuses 100, 400.

While FIGS. 10 and 11 and the following description solely illustrate the transparent plate 20A and the display device 10A for easier understanding, the illustration holds true for the other transparent plates 20B to 20D and the other display devices 10B to 10D.

(1) In the first embodiment and the modification described above, the side surface 26A of the transparent plate 20A is a flat surface parallel to the normal direction nd of the display surface 11A1 (viewer-side surface) of the display section 11A; however, the side surface 26A may be a curved surface or may be comprised of a combination of flat surfaces and/or curved surfaces. Further, a reflective layer, for example, may be formed on the side surface 26A. The same holds true for the other transparent plates 20B to 20D.

For example, as shown in FIG. 10(a), it is possible to form a reflective layer 50, which is capable of reflecting light, on the side surface 26A of the transparent plate 20A. By causing incident light to reflect from the reflective layer 50 on the side surface 26A and allowing at least part of the reflected light to exit the light exit-side deflection portion 22A or 42A, it becomes possible to further reduce the visibility of the non-display area (joint portion) and enhance image continuity.

As shown in FIG. 10(b), at least part of the side surface 26A may be an inclined surface 28A inclined at an angle with respect to the normal direction of the display surface. Further, a reflective layer 50 may be formed on the entire side surface 26A including the inclined surface 28A.

As shown in FIG. 10(c), it is also possible to design the side surface 26A as a curved surface, and to form a reflective layer 50 on the curved surface.

The reflective layer 50 may have surface irregularities (i.e. concavity and convexity) on the side facing the side surface 26A. The surface irregularities diffusedly reflex light that enters the side surface 26A. This can increase the amount of light which is reflected from the side surface 26A and exits the light exit-side deflection portion 22A or 42A, thereby increasing the brightness of an image. Such surface irregularities may be formed on the side surface 26A and the inclined surface 28A facing the reflective layer 50. A bonding layer 30 may be provided as illustrated in FIGS. 10(b) and 10(c) to increase the bonding strength between the transparent plate 20A and the display device 10A.

(2) In the first embodiment and the modification described above, the transparent plate section 20 is comprised of an array of the transparent plates 20A to 20D which are separate members and arranged adjacent to each other; however, the transparent plates 20A to 20D may be comprised of parts of a single plate-like member. FIG. 11(a) shows a variation of the array-type display apparatus 100, 400 in a cross-section corresponding to the cross-section taken along the line A-A of FIG. 1, illustrating the variation in which the transparent plate section 20 is comprised of a single plate-like member. The use of such a transparent plate section 20 allows the viewer to more perceive the display screen, on which an image is displayed, as one screen. This allows the viewer to view an image with enhanced continuity.

(3) In the first embodiment and the modification described above, the display devices 10A to 10D and the transparent plates 20A to 20D are arranged planarly in the array-type display apparatus 100, 400; however, it is also possible to arrange constituent display devices in a non-planar manner. For example, as shown in FIG. 11(b), the display devices 10A to 10C and the transparent plates 20A to 20C may be arranged such that the adjacent display surfaces of the display sections 11A to 11C make an angle with each other. This can improve the convenience and the design of the array-type display apparatus, making it possible to display an image to the viewer O in a manner suited for the intended use and the environment.

(4) In the first embodiment and the modification described above, the display surfaces of the display sections 11A to 11D of the display devices 10A to 10D are flat surfaces; however, the display surfaces may be curved surfaces, such as a cylindrical surface or a spherical surface. When using curved display surfaces, the transparent plates 20A to 20D (especially the planar portions 21A to 21D and the light entrance portions 24A to 24D) may have a shape that follows the shape of the display surfaces.

(5) Depending on the intended optical performance, etc., the transparent plates 20A to 20D may optionally contain a diffusing agent, or may have a matte surface. Further, various functional layers, such as an anti-glare layer, an antireflection layer, a hard coat layer, an antifouling layer, an antistatic layer, an ultraviolet absorbing layer, a touch panel layer, etc. may be provided on the viewer side of the transparent plates 20A to 20D.

(6) In the first embodiment and the modification described above, the array-type display apparatus 100, 400 is comprised of an array of the display devices 10A to 10D and the corresponding array of the transparent plates 20A to 20D; however, a transparent plate, e.g. the transparent plate 20A, may be provided in a common display device (e.g. comprised solely of the display device 10A) so as to reduce the visibility of a non-display area composed of a frame member or the like.

Second Embodiment

A second embodiment of the present invention will now be described with reference to FIGS. 12 through 22. The array-type display apparatus 600 of the second embodiment differs from the above-described array-type display apparatus of the first embodiment in that each transparent plate 20 further has a light entrance-side deflection portion at least in an area of a peripheral part of the display device 510-side surface, the area facing a display section 511 when viewed in the normal direction of the display surface of the display section 511. The other construction of the array-type display apparatus of the second embodiment can be the same as the first embodiment or the above-described modification or variations. For easier understanding, the following description, given with reference to FIGS. 12 through 22, illustrates a case where the transparent plates 520 of the array-type display apparatus 600 each have no corner deflection portion. However, the transparent plates of the array-type display apparatus of the second embodiment may, of course, be provided with corner deflection portions.

Figure 12:
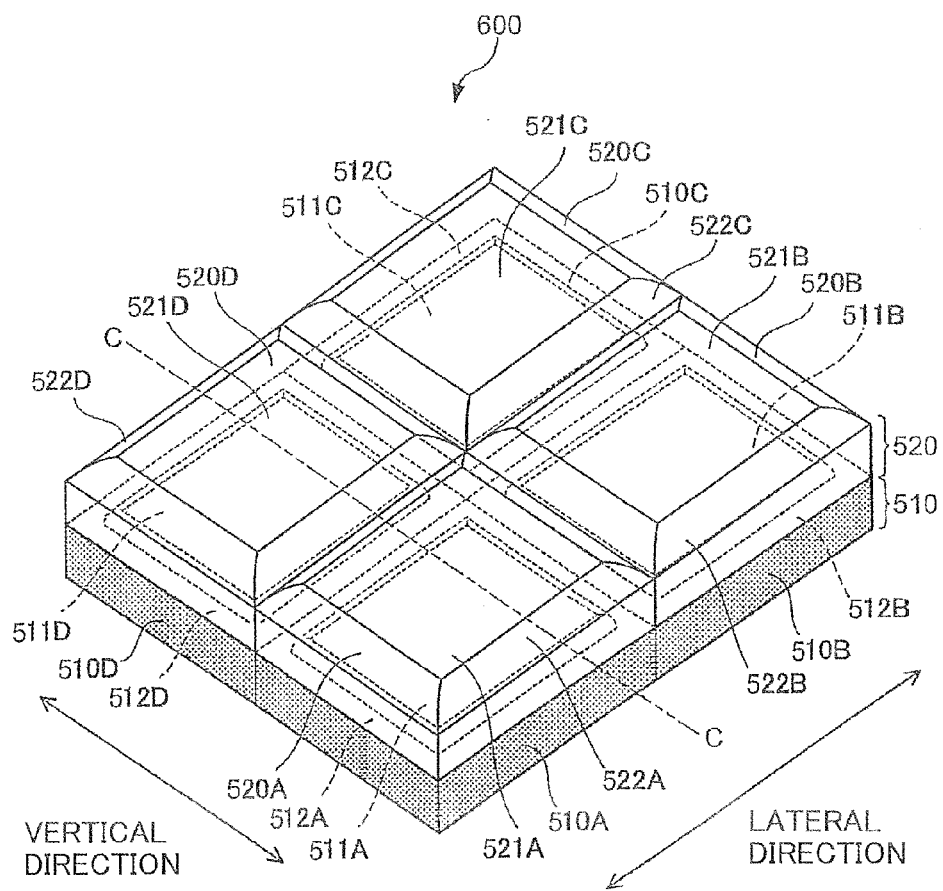
FIG. 12 is a perspective view illustrating an array-type display apparatus according to a second embodiment of the present invention.

FIG. 12 is a diagram illustrating the array-type display apparatus 600 of this embodiment.

Figure 13:
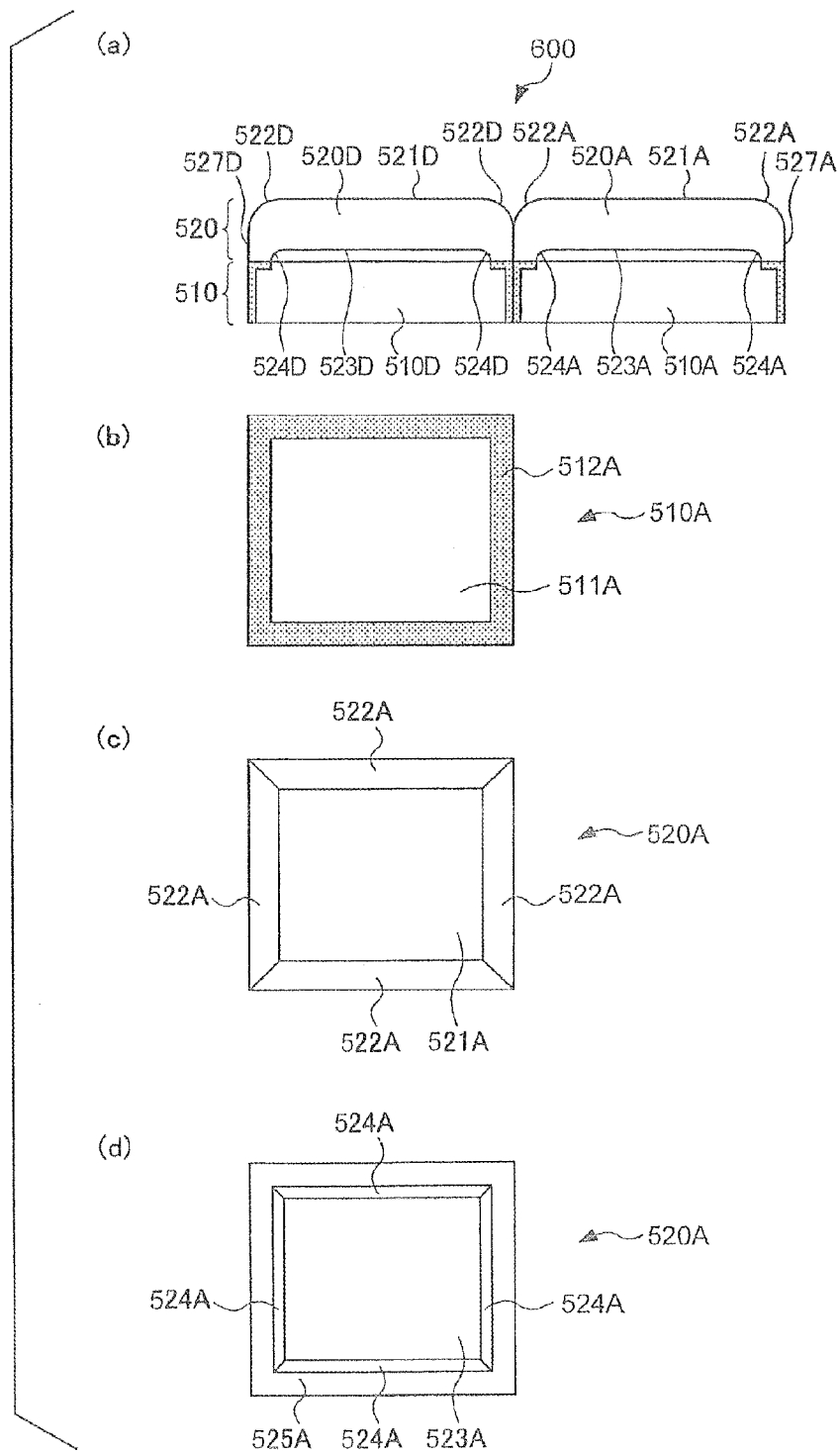
FIG. 13 shows diagrams illustrating display devices and transparent plates, provided in the array-type display apparatus shown in FIG. 12.

FIG. 13 shows diagrams illustrating a display device 510A and a transparent plate 520A, provided in the array-type display apparatus 600 of this embodiment. FIG. 13(a) shows the array-type display apparatus 600 in a cross-section taken along the line C-C of FIG. 12 and parallel to the thickness direction of the array-type display apparatus 600. FIG. 13(b) is a plan view of the display device 510A as viewed from the viewer in the front direction. FIG. 13(c) is a plan view of the transparent plate 520A as viewed from the viewer in the front direction, while FIG. 13(d) is a plan view of the transparent plate 520A as viewed from the display device 510A in the front direction. For easier understanding, FIGS. 13(b), 13(c), 13(d) show only the display device 510A or the transparent plate 520A as a representative; the other display devices 510B to 510D or the other transparent plates 520B to 520D have the same shape as the display device 510A or the transparent plate 520A.

The array-type display apparatus 600 of this embodiment includes a display device section 510 and a transparent plate section 520. The transparent plate section 520 is provided on the viewer side (light exit side) of the display device section 510 and, in this embodiment, is bonded to the display device section 510 via a not-shown bonding layer provided between the transparent plate section 520 and the display device section 510. The bonding layer, which bonds the transparent plate section 520 and the display device section 510 together, preferably has a high light transmittance and has the same refractive index as the transparent plate section 520 (with no substantial difference between their refractive indices), and is optically equivalent to the transparent plate section 520.

As shown in FIG. 12, the display device section 510 is comprised of an array of display devices to display images. In the display device section 510 of this embodiment, the display devices 510A to 510D are arranged adjacent to each other such that the viewer-side surfaces (display surfaces) of display sections 511A to 511D, which are capable of displaying images, lie in a plane.

The display devices 510A to 510D are arranged in a 2×2 matrix (two in the vertical direction and two in the lateral direction when the array-type display apparatus 600 is in use). The number of the display devices, constituting the array-type display apparatus 600, is not limited to 4, but may be 2, 6, 8 or other number depending on the screen size, etc.

As shown in FIG. 13(b), when viewed in the normal direction nd (see FIG. 14) of the display surface 511A1 of the display section 511A, the display device 510A includes the display section 511A, which is capable of displaying images, and a non-display area 512A located around the display section 511A and which does not display images. The non-display area 512A may be composed of, for example, a frame member or an electrode section.

The display section 511A of this embodiment has a generally-rectangular shape, and the non-display area 512A is located around and adjacent to the display section 511A. The display device 510A has been described as a representative example; the other display devices 510B to 510D have the same construction. The display devices 510A to 510D may be plasma display devices, liquid crystal display devices, organic EL display devices (organic LED display devices), or the like, or may be rear projection display devices.

The transparent plate section 520 is comprised of a transparent generally-flat plate-like member disposed on the viewer side of the display device section 510. As shown in FIG. 12, the transparent plate section 520 of this embodiment is comprised of an array of transparent plates 520A to 520D arranged adjacent to each other in a 2×2 matrix (two in the vertical direction and two in the lateral direction when the array-type display apparatus is in use) and has a generally-flat plate-like shape.

The transparent plates 520A to 520D are disposed in positions corresponding to the display devices 510A to 510D, respectively. The transparent plates 520A to 520D are disposed nearer to the viewer than the display sections 511A to 511D of the corresponding display devices 510A to 510D, and cover the display sections 511A to 511D and the non-display areas 512A to 512D of the display devices 510A to 510D.

The transparent plates 520A to 520D of the transparent plate section 520 are preferably formed of a transparent material having a high light transmittance. Specific examples of the material for the transparent plates 520A to 520D include a polycarbonate (PC) resin, an acrylic resin, a styrene resin, an olefin resin, glass, ceramics, etc. The transparent plates 520A to 520D can be produced by subjecting the material to e.g. injection molding or casting.

The transparent plates 520A, 520B, 520C, 520D are disposed on the viewer side of the display devices 510A to 510D in positions corresponding to the display devices 510A, 510B, 510C, 510D, respectively. When viewed in the front direction of the array-type display apparatus 600, the sizes of the transparent plates 520A to 520D coincide with the sizes of the corresponding display devices 510A to 510D.

The transparent plates 520A to 520D are each a generally-flat plate-like member.

As shown in FIG. 13(c), the transparent plate 520A has a viewer-side (light exit-side) surface consisting of a planar portion 521A and a light exit-side deflection portion 522A located around the planar portion 521A. Further, as shown in FIG. 13(d), the transparent plate 520A has a display device section 510A-side (light entrance-side) surface consisting of a planar portion 523A, a light entrance-side deflection portion 524A located around the planar portion 523A, and a bonding portion 525A provided in an area around the light entrance-side deflection portion 524A and corresponding to the non-display area 512A.

As shown in FIG. 13(a), the side surface 527A is parallel to the thickness direction of the transparent plate 520A and perpendicular to the planar portions 521A, 523A.

The transparent plate 520A has been described as a representative example; the other transparent plates 520B to 520D have the same construction.

Figure 14:
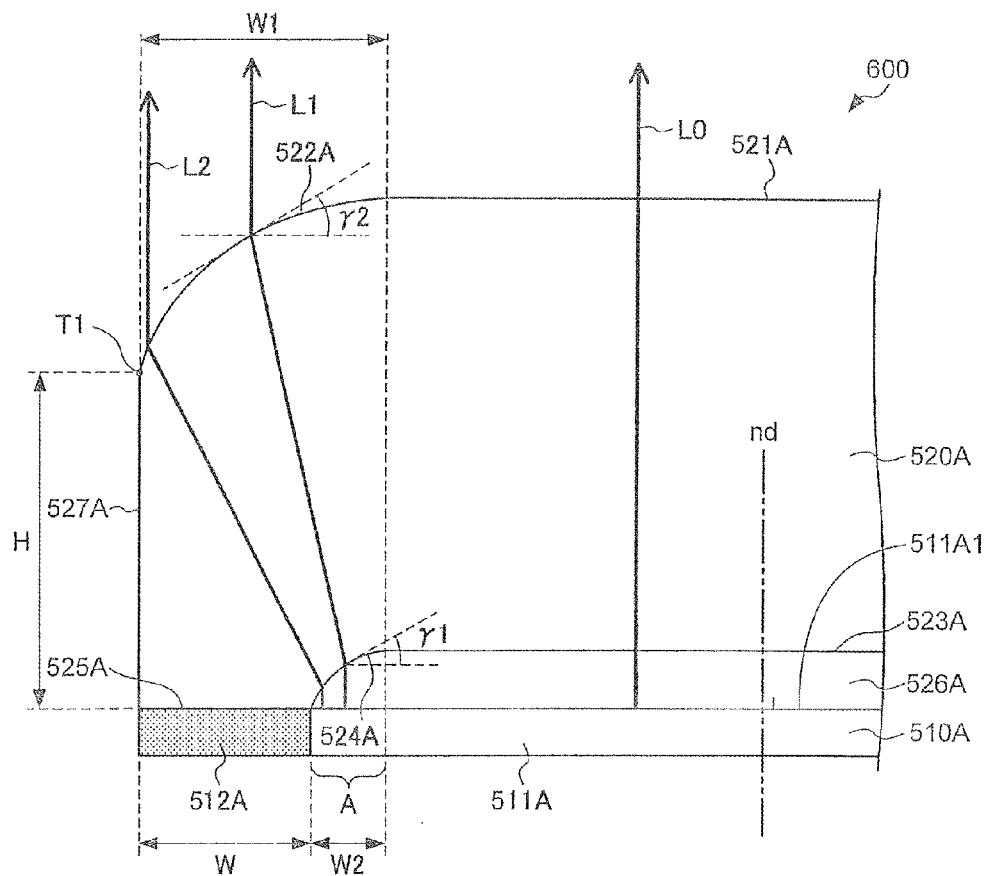
FIG. 14 is a cross-sectional view of the array-type display apparatus shown in FIG. 12.

In this embodiment, as shown in FIGS. 12 and 13, when viewed in the front direction (normal direction of the planar portions 520A to 520D), the light exit-side deflection portions 522A to 522D are each located in a peripheral end area of the viewer-side surface of each of the transparent plates 520A to 520D. The bonding portions 525A to 525D and the inner adjacent light entrance-side deflection portions 524A to 524D are each located in a peripheral end area of the display device portion 510-side surface of each of the transparent plates 520A to 520D. As shown in FIGS. 12 to 14, the light exit-side planar portions 521A to 521D and the light entrance-side planar portions 523A to 523D have a size which is slightly smaller than the size of the display sections 511A to 511D.

FIG. 14 is a cross-sectional view of the array-type display apparatus 600 of this embodiment. FIG. 14 shows an enlarged cross-sectional view of a portion of the array-type display apparatus 600 in a cross-section taken along the line C-C of FIG. 12 and parallel to the thickness direction of the array-type display apparatus 600. For easier understanding, FIG. 14 shows only the display device 510A and the transparent plate 520A and, in addition, depicts the display device 510A in a greatly simplified manner. The cross-section of FIG. 14 is perpendicular to the side surface 527A whose longitudinal direction is parallel to the longitudinal direction of the light exit-side deflection portion 522A shown in FIG. 14 and which is located adjacent to the light exit-side deflection portion 522A, and is also perpendicular to the display surface 511A1 of the display section 511A.

FIG. 14 and the below-described FIGS. 15 to 18 show the cross-section perpendicular to one side (side surface) of the display device 510A and one side (side surface) of the transparent plate 520A; the display device 510A and the transparent plate 520A have the same cross-sectional shape in the corresponding cross-sections perpendicular to the other sides. While the following description solely illustrates the display device 510A and the transparent plate 520A for easier understanding, the description holds true for the other display devices 510B to 510D and the other transparent plates 520B to 520D unless otherwise stated.

The planar portion 521A on the light exit side of the transparent plate 520A is parallel to the display surface 511A1 (viewer-side surface) of the display section 511A. When viewed in the front direction, the planar portion 521A has a shape similar to the shape of the display surface of the display section 511A and, in this embodiment, has a rectangular shape.

The light exit-side deflection portion 522A is provided around and adjacent to the planar portion 521A (see FIG. 12 and FIGS. 13(a) and 13(c)). In particular, the light exit-side deflection portion 522A is provided at least in an area of a peripheral area of the viewer-side surface, the area facing the non-display area 512A when viewed in the normal direction nd of the display surface 511A1 of the display section 511A. The light exit-side deflection portion 522A of this embodiment is a curved surface convexed toward the viewer, and the angle γ2 formed between the tangent plane at a point on the surface and a plane parallel to the display surface of the display section 511A (plane parallel to the planar portion 521A) gradually increases as the point moves from an inner position toward an outer or peripheral position on the transparent plate 520A.

The light exit-side deflection portion 522A is formed such that it is nearer to the display device 510A at an outer or peripheral position on the transparent plate 520A than at an inner position (nearer to the planar portion 521A) on the transparent plate 520A. In the cross-section shown in FIG. 14, the outermost point T1 on the light exit-side deflection portion 522A is nearest to the display device 510A in the thickness direction of the transparent plate 520A.

The planar portion 523A on the light entrance side of the transparent plate 520A is parallel to the display surface 511A1 (viewer-side surface) of the display section 511A. When viewed in the front direction, the planar portion 523A has a shape similar to the shape of the display surface 511A1 of the display section 511A and, in this embodiment, has a rectangular shape.

The light entrance-side deflection portion 524A is located around and adjacent to the planar portion 523A. The light entrance-side deflection portion 524A is provided at least in an area of a peripheral part of the display device 510A-side surface of the transparent plate 520A, the area facing the display section 511A when viewed in the normal direction nd of the display surface 511A1 of the display section 511A (see FIG. 13(d)). The light entrance-side deflection portion 524A of this embodiment is a curved surface convexed toward the viewer, and the angle γ1 formed between the tangent plane at a point on the curved surface and a plane parallel to the display surface 511A1 of the display section 511A (plane parallel to the planar portion 523A) gradually increases as the point moves from an inner position toward an outer or peripheral position.

The bonding portion 525A is located in an outermost area of the display device 510A-side surface of the transparent plate 520A. In particular, the bonding portion 525A is located in an area around the light entrance-side deflection portion 524A and corresponding to the non-display area 512A, and projects toward the display device 510. The display device 510A-side surface of the bonding portion 525A is parallel to the viewer-side surface of the non-display area 512A. The bonding portion 525A and the non-display area 512A are bonded together via the bonding layer, whereby the transparent plate 520A and the display device 510A are bonded together. As shown in FIGS. 13(a) and 14, an air layer 526A having a predetermined thickness is formed between the light entrance-side deflection portion 524A, the planar portion 523A and the display section 511A.

In the cross-section shown in FIG. 14, W1 represents the width of the light exit-side deflection portion 522A, i.e. the distance between the outer end and the inner end of the light exit-side deflection portion 522A in a direction parallel to the display surface 511A1 of the display section 511A, W2 represents the width of the light entrance-side deflection portion 524A, and W represents the width of the non-display area 512A. H represents the distance from the outermost point T1 (point nearest to the display device 510A) on the light exit-side deflection portion 522A to the bonding surface of the bonding portion 525A in the thickness direction of the transparent plate 520A.

The deflecting actions of the light exit-side deflection portion 522A and the light entrance-side deflection portion 524A will now be described.

As shown in FIG. 14, light L0 that has exited an area of the display section 511A, facing the planar portion 523A, in the front direction (normal direction of the display surface) enters the planar portion 523A, passes through the transparent plate 520A and exits the planar portion 521A in the front direction.

On the other hand, in the cross-section of FIG. 14, lights L1, L2 that have exited an area A, which is a peripheral end area (adjacent to the non-display area 512A) of the surface of the display section 511A and which faces the light entrance-side deflection portion 524A, vertically to the display surface 511A1 enter the light entrance-side deflection portion 524A and are deflected outwardly at the interface between the air layer 526A and the light entrance-side deflection portion 524A. More specifically, at least part of each light L1, L2 is bent outwardly such that the angle of the traveling direction of each light with respect to the normal direction nd of the display surface 511A1 of the display section 511A becomes larger. The lights L1, L2 that have been bent at the light entrance-side deflection portion 524A pass through the transparent plate 520A and reach the light exit-side deflection portion 522A. The lights L1, L2 are deflected at the interface between the light exit-side deflection portion 522A and air, and are bent inwardly such that the angle of the traveling direction of each light with respect to the normal direction nd of the display surface 511A1 of the display section 511A becomes smaller. In this embodiment, the lights L1, L2 that have been bent at the light exit-side deflection portion 522A travel in the normal direction nd of the display surface 511A1 of the display section 511A. Accordingly, when a viewer views the display device 510A in the front direction, the viewer perceives an image being displayed over the entire area of the transparent plate 520A, without perceiving the non-display area 512A.

As described above, the angle γ1 at a point on the light entrance-side deflection portion 524A increases as the point moves outward. Therefore, the outward deflection (toward the non-display area) of light, which has vertically exited the display section 511A, enters the light entrance-side deflection portion 524A and passes through the transparent plate 520A, is larger as the light enters at an outer point on the light entrance-side deflection portion 524A. As described above, the angle γ2 at a point on the light exit-side deflection portion 522A increases as the point moves outward. Therefore, the inward deflection (toward the display section 511A) of light, which has been deflected outward at the light entrance-side deflection portion 524A and exits the light exit-side deflection portion 522A is larger as the light exits at an outer point on the light exit-side deflection portion 522A. And the light, which has exit the light exit-side deflection portion 522A, travels in the normal direction nd (front direction) of the display surface 511A1, Accordingly, an image displayed on the light exit-side deflection portion 522A is magnified from an image displayed on the area A. Therefore, an image as viewed through the transparent plate 520A is perceived as an image which is continuous over the entire area of the viewer-side surface of the transparent plate 520A and as a good image without a joint portion due to the non-display area 512A.

Figure 15:
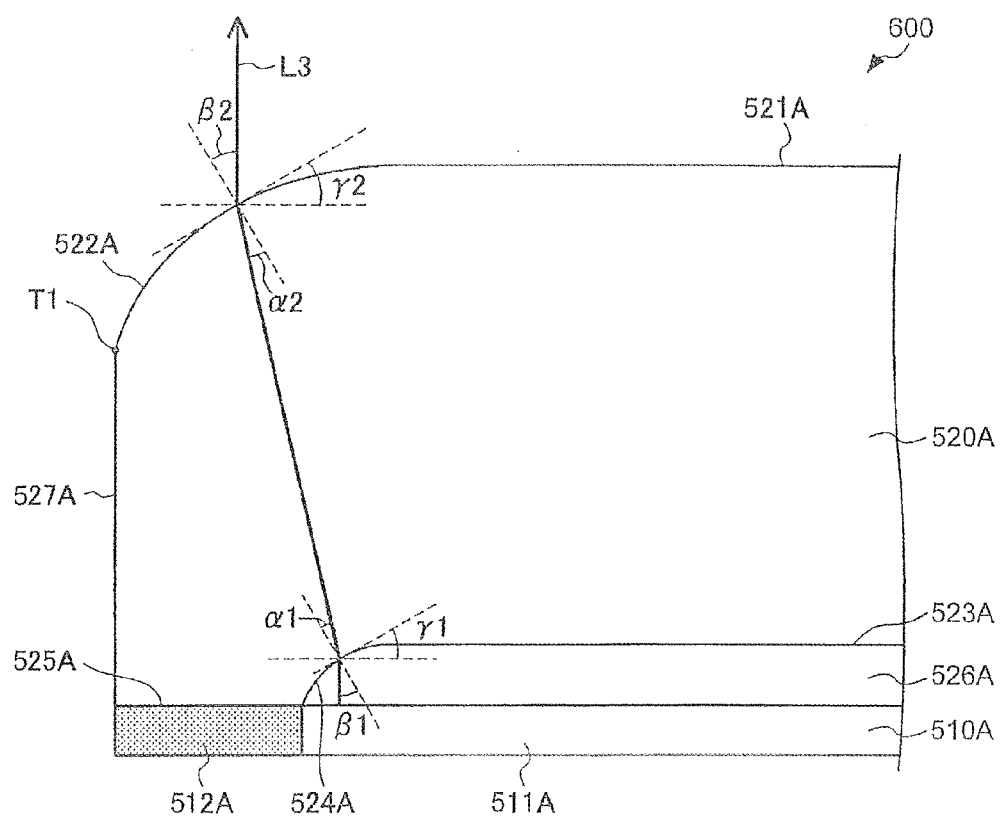
FIG. 15 is a cross-sectional view corresponding to FIG. 14, illustrating the light exit-side deflection portion and the light entrance-side deflection portion of a transparent plate in detail.
Figure 16:
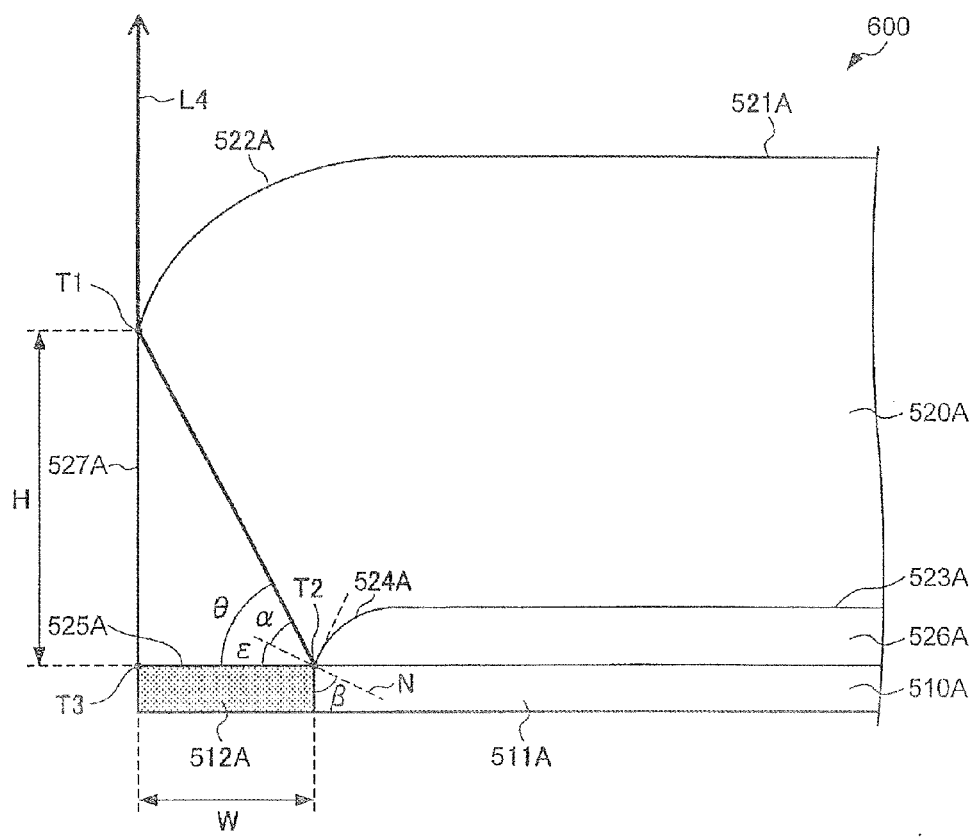
FIG. 16 is a cross-sectional view corresponding to FIG. 14, illustrating the dimensions of a peripheral end portion of the transparent plate.
Figure 17:
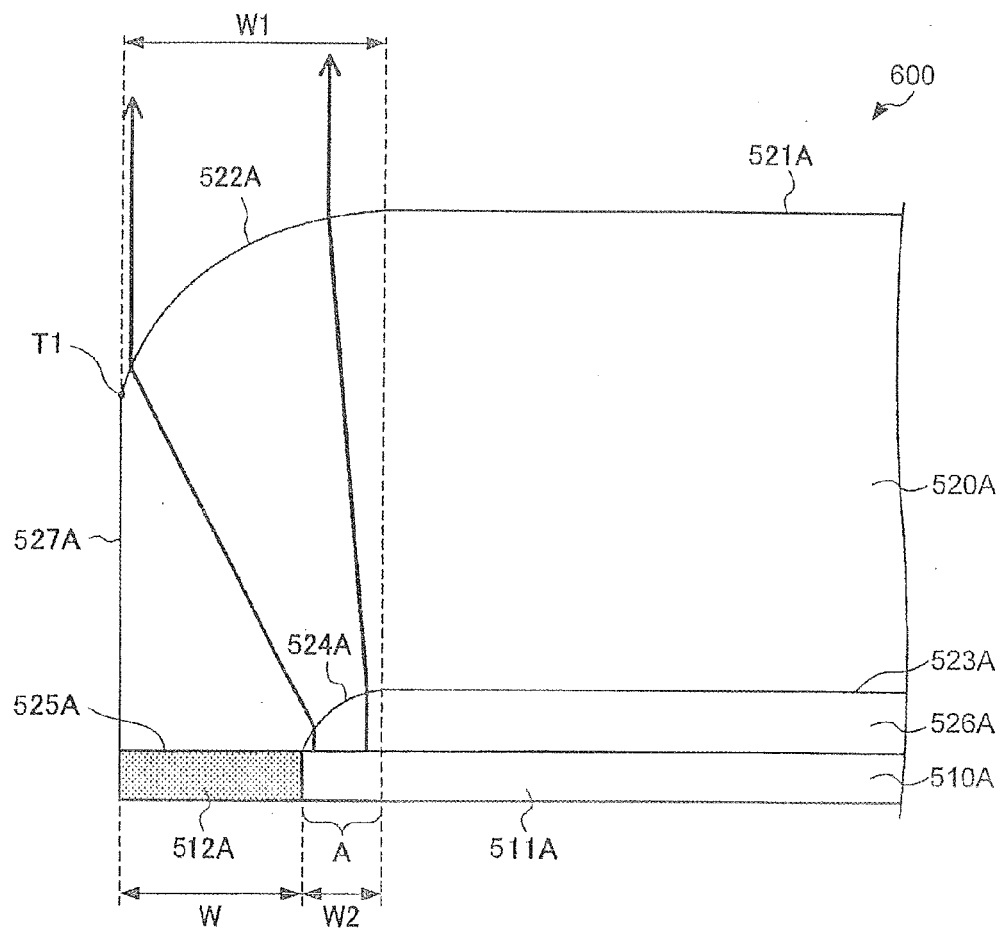
FIG. 17 is a cross-sectional view corresponding to FIG. 14, illustrating the magnification ratio of an image displayed on the light exit-side deflection portion.
Figure 18:
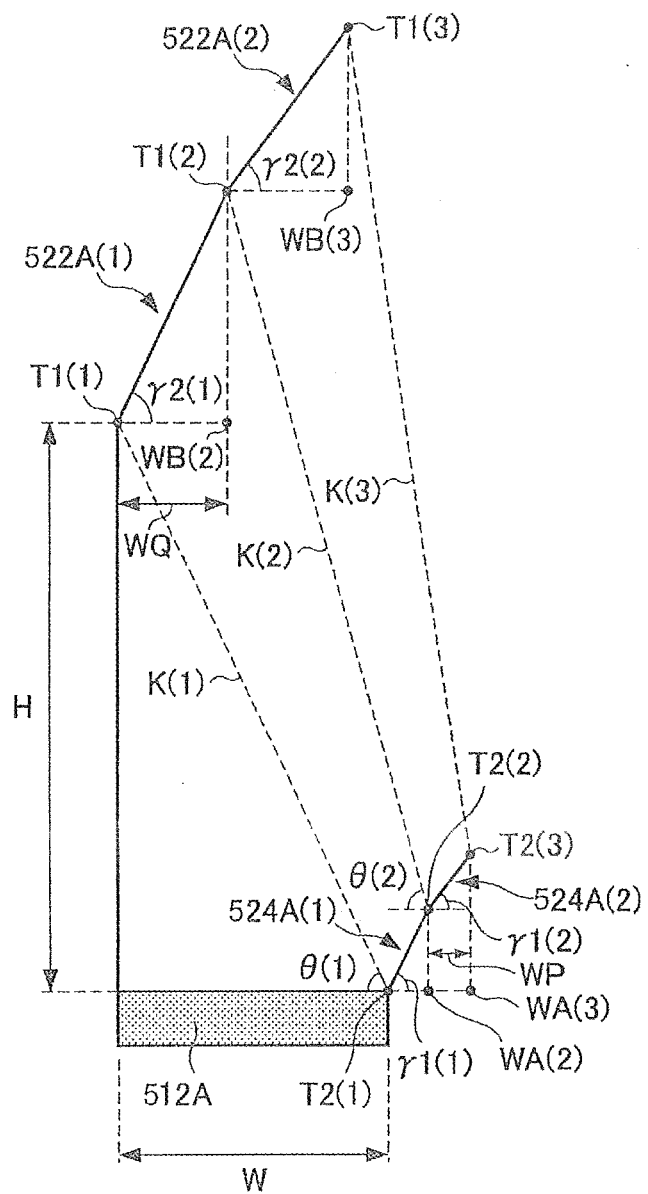
FIG. 18 is a diagram illustrating a method for designing the light exit-side deflection portion and the light entrance-side deflection portion of a transparent plate.

FIG. 15 is a diagram illustrating the shapes of the light exit-side deflection portion 522A and the light entrance-side deflection portion 524A of this embodiment in detail. FIG. 15 and the below-described FIGS. 16 to 18 show the same cross-section as that shown in FIG. 14. In order for light L3, exiting the display section 511A vertically to the surface (display surface) 511A1 of the display section 511A and entering the light entrance-side deflection portion 524A, to exit the light exit-side deflection portion 522A in the vertical direction (front direction) of the display surface 511A1, the angle γ1 formed between the tangent plane at the incident point of light L3 on the light entrance-side deflection portion 524A and a plane parallel to the display surface 511A1 is preferably equal to the angle γ2 formed between the tangent plane at the incident point (exit point) of light L3 on the light exit-side deflection portion 522A and a plane parallel to the display surface 511A1.

When γ1=γ2, the refraction angle α1 of light L3 at the light entrance-side deflection portion 524A is equal to the incident angle α2 of light L3 at the light exit-side deflection portion 522A. Accordingly, the incident angle β1 of light L3 at the light entrance-side deflection portion 524A is equal to the exit angle β2 of light L3 at the light exit-side deflection portion 522A. Thus, the traveling direction (front direction) of light L3 when it enters the light entrance-side deflection portion 524A is equal to the traveling direction of light L3 when it exits the light exit-side deflection portion 522A; the light L3 exits in the normal direction nd of the display surface 511A1.

It is therefore preferred to design the curves of the light entrance-side deflection portion 524A and the light exit-side deflection portion 522A in the cross-section shown in FIG. 15 and select the refractive index of the transparent plate 20A so that the relation "γ1=γ2" is satisfied.

From the viewpoint of reducing the visibility of a joint portion due to the non-display area 512A and enhancing image continuity, the light exit-side deflection portion 522A is preferably located at a certain distance from the non-display area 512A.

FIG. 16 illustrates the distance H at the peripheral end of the transparent plate 520A of this embodiment.

In the cross-section shown in FIG. 16, T2 represents the outermost point on the light entrance-side deflection portion 524A, lying at the boundary between the display section 511A and the transparent plate 520A, and T3 represents the point of intersection between the plane, passing through the point T2 and parallel to the display surface 511A1 of the display section 511A, and the straight line passing through the point T1 and perpendicular to the display surface 511A1 of the display section 511A. H represents the distance between the point T1 and the point T3 (in this embodiment is equal to the distance from the point T1 to the bonding surface of the bonding portion 525A in the thickness direction of the transparent plate 520A), and W represents the distance between the point T2 and the point T3 (in this embodiment is equal to the width of the non-display area 512A).

Further, θ (0°≤θ≤90°) represents the angle of the traveling direction of light L4 in the transparent plate 520A with respect to a plane parallel to the display surface 511A1, when the light L4 enters the transparent plate 520A at the point T2, passes through the transparent plate 520A and exits at the point T1 in the normal direction nd of the display surface 511A1 of the display section 511A. The distances H, W and the angle θ preferably satisfy the following formula (1):

$$H = W \times \tan\theta \tag{1}$$

The angle θ is equal to the sum of the angle ε formed between the normal N to the tangent plane at the point T2 and a plane parallel to the display surface 511A1 and the refraction angle α of light L4 that exits the display surface 511A1 in the normal direction and enters the transparent plate 520A at the point T2: θ=ε+α.

When the formula (1) is satisfied, the light L4, which has exited the display section 511A at the outermost point T2, exits the transparent plate 520A at the outermost point T1, as shown in FIG. 16. Thus, the light L4, which has entered the transparent plate 520A at the outermost point T2 on the light entrance-side deflection portion 524A in the normal direction nd of the display surface 511A1 of the display section 511A, passes through the transparent plate 520A and exits it at the outermost point T1 on the light exit-side deflection portion 522A, i.e. the point nearest to the display device 510A, in the normal direction nd of the display surface 511A1 of the display section 511A. Accordingly, an image is displayed on the entire area of the transparent plate 520A and the non-display area 512A is invisible.

Further, if the formula (1) is satisfied, light that has exited a peripheral portion of the display section 511A is not very likely to enter e.g. the adjacent transparent plate 520D; there will be no significant discontinuity with an image displayed e.g. on the adjacent display device 510D. Therefore, an image, which is comparable to an image as displayed on a single display device, can be displayed on the array-type display apparatus 600.

The array-type display apparatus 600 of this embodiment, which satisfies the above conditions, can display an image which is continuous over the entire area of the viewer-side surfaces of the transparent plates 520A to 520D, while preventing display of a joint portion due to the non-display areas 512A to 512D between the display devices 510A to 510D. The array-type display apparatus 600 of this embodiment can therefore display a good image comparable to an image as displayed on a single display device.

FIG. 17 is a diagram illustrating the magnification ratio of an image displayed on the light exit-side deflection portion 522A of this embodiment.

An image displayed on the area A of the display section 511A, from which light can exit which enters the light entrance-side deflection portion 524A in a direction parallel to the normal direction of the display surface of the display section 511A, is preferably reduced compared to an image displayed on the other area of the display section 511A.

An image, to be displayed by light that exits the area A in the normal direction nd of the display surface 511A1, is magnified by the light entrance-side deflection portion 524A and the light exit-side deflection portion 522A. An image displayed on the area A therefore needs to be reduced, compared to an image displayed on the other area of the display section 511A, so that an image displayed on the light exit-side deflection portion 522A is not magnified or reduced compared to an image displayed on the planar portion 521A, and that an image is displayed on the entire area of the viewer-side surface of the transparent plate 520A with high continuity and without a distortion. Thus, the reduction ratio of an image displayed on the area A is preferably equal to the reciprocal of the magnification ratio.

W2 represents the length of the line segment of intersection between the area A1 and a plane perpendicular to the end surface 527A of the transparent plate 520A and to the display surface 511A1 of the display section 511A (i.e. the width of the area A, shown in FIG. 17, which is equal to the width of the light entrance-side deflection portion 524A), and W1 represents the width of the light exit-side deflection portion 522A, shown in FIG. 17 (i.e. the distance between the outer end and the inner end in a direction parallel to the display surface 511A1 of the display section 511A). The magnification ratio is W1/W2. Therefore, the reduction ratio is preferably equal to W2/W1. In other words, in the display device 510A, an image formed on the display surface 511A1 by light that exits that area of the display section 511A which faces the light entrance-side deflection portion 524A when viewed in the normal direction nd of the display surface 511A1 of the display section 511A, is preferably reduced to W2/W1 of an image formed on the display surface 511A1 by light that exits the other area of the display section 511A.

Because an image displayed on the light exit-side deflection portion 522A has been magnified as described above, the luminance of the image has decreased to W2/W1 of the luminance on the area A. It is therefore desirable to make the luminance of an image, displayed on the area A, W1/W2 times higher than the luminance of an image displayed on the other area of the display section 511A. This makes it possible to make the luminance of an image, displayed on the transparent plate 520A, uniform over the entire area.

When an image is thus magnified by the light entrance-side deflection portion 524A and the light exit-side deflection portion 522A at the above-described magnification ratio, the image is preferably magnified uniformly regardless of the position in the width direction of the light exit-side deflection portion 522A. A description will now be given of a method for designing the light exit-side deflection portion 522A and the light entrance-side deflection portion 524A which can uniformly magnify an image in the width direction of the light exit-side deflection portion 522A and the light entrance-side deflection portion 524A.

FIG. 18 is a diagram illustrating a method for designing the light exit-side deflection portion 522A and the light entrance-side deflection portion 524A of this embodiment.

In general, when designing a curved line, the curved line can be designed as a collection of small line segments. Thus, in the cross-section shown in FIG. 14, etc., the curved line of each of the curved surfaces of the light exit-side deflection portion 522A and the light entrance-side deflection portion 524A can be designed as a collection of small line segments:

First, the outermost point T2 on the light entrance-side deflection portion 524A is used as a starting point and represented by T2(1). A straight line 524A(1), which makes an angle γ1(1) with a plane parallel to the display surface 511A1 and extends obliquely upward and inward, is drawn from the point T2(1).

If the angle γ1(1) is too small, the distance H between the point T2 and the point T1 in the thickness direction of the transparent plate 520A is too large. If the angle γ1(1) is too large, light which exits the display section 511A in a direction perpendicular to the display surface 511A1, enters the transparent plate 520A at the point T2(1) and is deflected there, and travels in the transparent plate 520A, will be totally reflected from the light exit-side deflection portion 522A and will not exit the transparent plate 520A. Therefore, the angle γ1(1) is preferably set in the range of 500 to 700, more preferably around 600. FIG. 18 illustrates the case of γ1(1)=650.

Next, the width W2 of the light entrance-side deflection portion 524A is divided into a predetermined number of divisions. The width of each division is preferably not more than about 100 μm, because a curved line is preferably perceived not as a collection of small line segments but as a curved line. Thus, when the width W2 is on the order of a few mm, it is preferably divided into at least 100 divisions. The width of each division is represented by WP. WA(2) represents a point as defined by inwardly moving the point T2(1) a distance WP parallel to the display surface 511A1 of the display section 511A. The point is represented by WA(2), not WA(1), in order to use the same argument (figure in parentheses) for parameters, such as angle, at the same point.

A straight line is drawn from the point WA(2), extending in the normal direction nd of the display surface 511A1 of the display section 511A. T2(2) represents the point of intersection between the straight line and the above-described straight line 524A(1). 524A(1) also represents the line segment connecting the point T2(1) on the light entrance-side deflection portion 524A with the point T2(2). To avoid complication and facilitate understanding, the same reference numeral is used both for a line and for a small line segment which is part of the line.

Next, an outermost line segment of the light exit-side deflection portion 522A is designed. The outermost point T1(1) on the light exit-side deflection portion 522A, as a starting point, is determined by the angle γ1(1) and the width W of the non-display area 512A. In particular, light that has exited the display section 511A in the normal direction nd of the display surface 511A1 of the display section 511A and reached the line segment 524A(1), is deflected at the line segment 524A(1) and travels in the transparent plate 520A in a direction which makes an angle θ(1), expressed by the following formula, with a plane parallel to the display section 511A:

$$\theta(1)=90°-\gamma1(1)+\arcsin((\sin(\gamma1(1)))/N)$$

where N represents the refractive index of the transparent plate 520A.

Thus, light that has exited the display section 511A in the normal direction nd of the display surface 511A1 and entered the transparent plate 520A at the point T2(1), travels in a light path, represented by the line segment K(1), in the transparent plate 520A. In the transparent plate 520A, the light travels the above-described distance H toward the light-exit side in a direction perpendicular to the display surface of the display section 511A while outwardly traveling a distance equal to the width W of the non-display area 512A. The distance H can be expressed by the following formula:

$$H=W\times\tan(\theta(1))$$

T1(1) represents a starting point as defined by moving the point T2 the distance H in a direction perpendicular to the display section 511A and outwardly moving the point T2 a distance equal to the width W of the non-display area 512A.

Next, a line segment of the light exit-side deflection portion 522A, extending from the starting point T1(1), is determined:

As described above with reference to FIG. 15, the angle γ1(1) is preferably equal to the angle γ2(1) (γ1(1)=γ2(1)) from the viewpoint of displaying a good image without a distortion. The angle γ1(1) and the angle γ2(1) are as follows:

Angle γ1(1): angle formed between the tangent plane at the incident point of light, which has exited the display section 511A in the normal direction nd of the display surface 511A1, on the light entrance-side deflection portion 524A and a plane parallel to the display surface 511A1 of the display section 511A Angle γ2(1): angle formed between the tangent plane at the incident point of said light on the light exit-side deflection portion 522A and a plane parallel to the display surface 511A1 of the display section 511A Therefore, a straight line 522A(1) is drawn from the point T1(1) in a direction at the angle γ2(1) which is equal to the angle γ1(1). WB(2) represents a point as defined by inwardly moving the point T1(1) a distance, which is equal to the width WQ, in a direction parallel to the display surface 511A1.

The width WQ can be expressed by the formula: WQ=WP× W1/W2.

The "W1/W2" is the magnification ratio of an image displayed on the light exit-side deflection portion 522A. By designing the width WQ to satisfy the formula, it becomes possible for light, which has entered the light entrance-side deflection portion 524A over the entire area in the width direction, to be uniformly magnified and exit the light exit-side deflection portion 522A over the entire area in the width direction. An image can therefore be displayed without a distortion.

A straight line is drawn from the point WB(2), extending in the normal direction nd of the display surface 511A1 of the display section 511A. T1(2) represents the point of intersection between the straight line and the straight line 522A(1). 522A(1) also represents the line segment connecting the starting point T1(1) on the light exit-side deflection portion 522A with the point T1(2).

Next, a line segment 524A(2), extending inwardly from the point T2(2) on the light entrance-side deflection portion 524A, is determined:

As described above, "W1/W2" is the magnification ratio of an image displayed on the light exit-side deflection portion 522A. Accordingly, the line segment 524A(2) is designed so that light, which enters the transparent plate 520A at the point T2(2) and is deflected by the line segment 524A(2) extending inwardly from the point T2(2), will reach the point T1(2).

Thus, the angle γ1(2) and the angle θ(2) should be set so that light that exits the display section 511A in the normal direction nd of the display surface 511A1 of the display section 511A, will be deflected by the line segment 524A(2) and travel in a light path, represented by the line segment K(2) connecting the point T2(2) and the point T1(2).

In particular, a straight line 524A(2) is drawn in a direction which makes the angle γ1(2) with a plane parallel to the display surface 511A1 of the display section 511A. The angle γ1(2) and the angle θ(2), i.e. the angle formed between the traveling direction of light from the line 524A(2) in the transparent plate 520A and a plane parallel to the display section 511A, satisfy the following formula:

$$\theta(2)=90°-\gamma1(2)+\arcsin((\sin(\gamma1(2)))/N)$$

where N represents the refractive index of the transparent plate 520A.

WA(3) represents a point as defined by inwardly moving the point WA(2) a distance, which is equal to the width WP, in a direction parallel to the display surface 511A1. A straight line is drawn from the point WA(3), extending in the normal direction nd of the display surface 511A1. T2(3) represents the point of intersection between the straight line and the straight line 524A(2). 524A(2) also represents the line segment connecting the point T2(2) and the point T2(3).

Thereafter, a line segment 522A(2) is determined from the line segment 524A(2) in the same manner as the above-described manner in which the line segment 522A(1) is determined from the line segment 524A(1). Subsequently, a line segment 524A(3) is determined from the line segment 522A(2) in the same manner as the above-described manner in which the line segment 524A(2) is determined from the line segment 522A(1).

By repeating such steps to sequentially determine line segments, a collection of small line segments, corresponding to the light entrance-side deflection portion 524A, and a collection of small line segments, corresponding to the light exit-side deflection portion 522A, can be determined in the cross-section shown in FIG. 14.

By thus approximating each of the curves of the light entrance-side deflection portion 524A and the light exit-side deflection portion 522A in the cross-section of FIG. 14 by a collection of small line segments as designed in the above-described manner, it becomes possible to display a good image which can be magnified W1/W2 times uniformly in the width direction.

Figure 22:
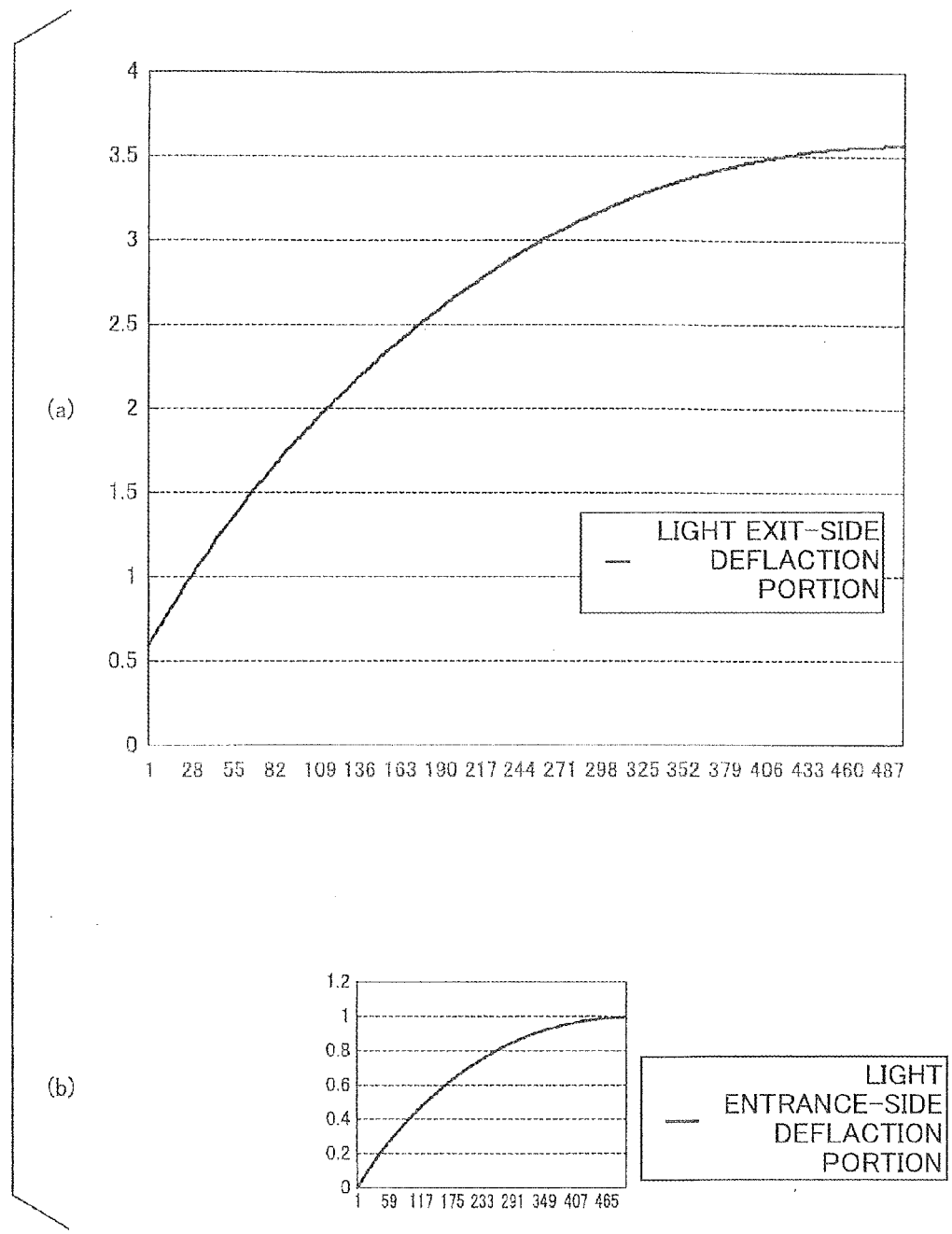
FIG. 22 shows diagrams illustrating examples of the shapes of the light exit-side deflection portion and the light entrance-side deflection portion of the transparent plate shown in FIG. 12.

FIG. 22 shows diagrams illustrating examples of the shapes of the light exit-side deflection portion 522A and the light entrance-side deflection portion 524A of this embodiment.

The diagrams each show an example of a collection of small line segments which approximates the curve of the light exit-side deflection portion 522A or the curve of the light entrance-side deflection portion 524A in the cross-section shown e.g. in FIG. 14. The collections of small line segments can be calculated by the above-described calculation method. In particular, FIG. 22(a) shows the collection of small line segments which approximates the curve of the light exit-side deflection portion 522A in the cross-section shown in FIG. 14, and FIG. 22(b) shows the collection of small line segments which approximates the curve of the light entrance-side deflection portion 524A in the cross-section shown in FIG. 14. In FIG. 22, the ordinate represents the dimension in the thickness direction of the transparent plate 520A, using relative values taking the width W of the non-display section 512A as 3, and the abscissa represents the division number for the light exit-side deflection portion 522A or the light entrance-side deflection portion 524A in the width direction, with the maximum value being 500.

The curves illustrated in FIG. 22 are calculated by the above-described calculation method under the following conditions:

The division number (number of line segments 524A) of the width W2 of the light entrance-side deflection portion 524A is 500 (i.e. the division number (number of line segments 522A) of the width W1 of the light exit-side deflection portion 522A is also 500)

The angle γ1(1) formed between the line segment 524A(1) and a plane parallel to the display surface at the starting point T2(1) on the light entrance-side deflection portion 524A=600

The magnification ratio W1/W2=3.0

The refractive index of the transparent plate 520A=1.49

The ratio of the width W of the non-display area 512A to the width W2 of the light entrance-side deflection portion 524A (W/W2)=2.0 By designing the entrance-side deflection portion 524A and the light exit-side deflection portion 522A in the cross-section of FIG. 14 through approximation of the respective curves by a collection of small line segments as shown in FIG. 22, it becomes possible to provide an array-type display apparatus which allows light to exit the light exit-side deflection portion 522A in the front direction and which can display a good image with high continuity and without a distortion.

With the provision of the transparent plate section 520 comprised of the transparent plates 520A to 520D having the above-described shape, and the display device section 510 comprised of the display devices 510A to 510D, the array-type display apparatus 600 can display a good image with high continuity while making the non-display area invisible.

Further, there is no need to form a complicated lens or the like in each transparent plate; the array-type display apparatus 600, capable of displaying such a good image, can be produced with ease.

Figure 19:
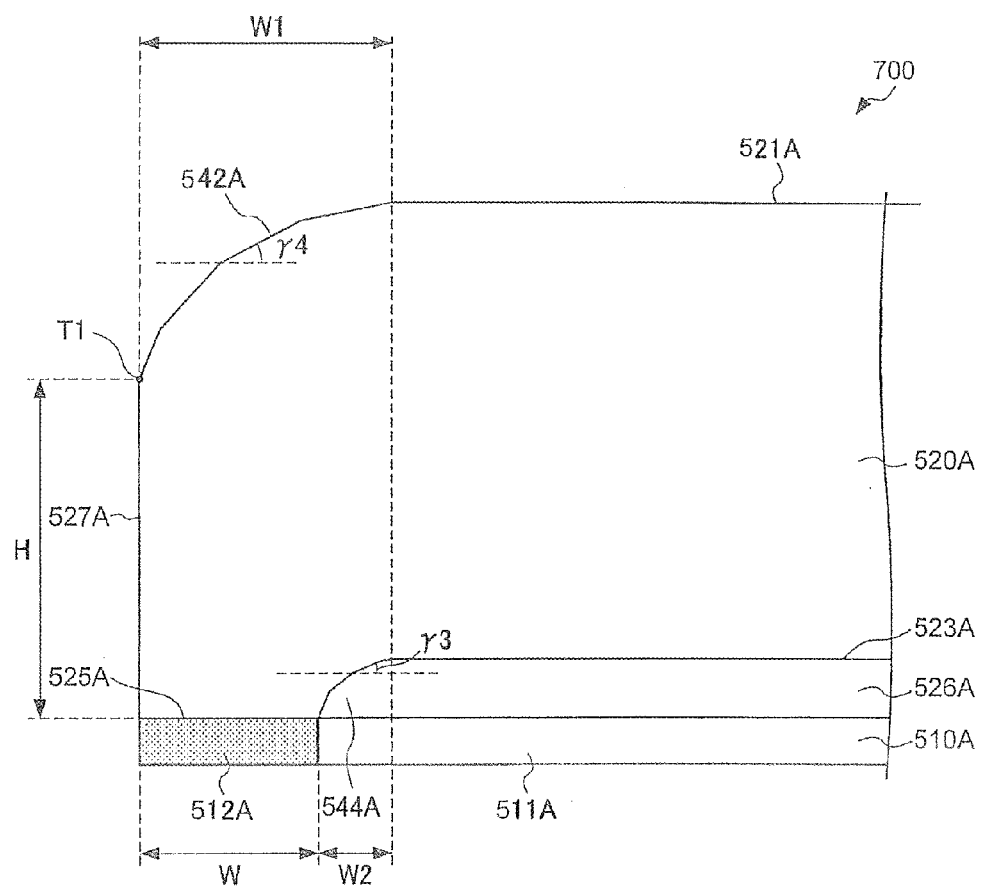
FIG. 19 is a diagram illustrating an array-type display apparatus which is a modification of the array-type display apparatus shown in FIG. 12.

FIG. 19 is a diagram illustrating an array-type display apparatus 700 which is a modification of the above-described array-type display apparatus of the second embodiment. FIG. 19 shows the array-type display apparatus 700 in a cross-section corresponding to the cross-section shown in FIGS. 14 through 18.

The array-type display apparatus 700 has the same shape as the array-type display apparatus 600 of the second embodiment except that the light exit-side deflection portion 542A and the light entrance-side deflection portion 544A, formed in the transparent plate 520A, are not curved but polygonally curved and each consist of a number of inclined surfaces (flat surfaces) arranged in the inner-outer direction.

Therefore, the same reference numerals or the same last symbols are used for those portions which perform the same function, and a duplicate description thereof will be omitted. While the following description solely illustrates the display device 510A and the transparent plate 520A for easier understanding, the description holds true for the other not-shown display devices 510B to 510D and the other not-shown transparent plates 520B to 520D.

As shown in FIG. 19, the light exit-side deflection portion 542A and the light entrance-side deflection portion 544A each consist of a number of flat surfaces (inclined surfaces). The angle γ4 formed between each inclined surface of the light exit-side deflection portion 542A and a plane parallel to the display surface 511A1 (see FIG. 14) of the display section 511A gradually increases with distance from the innermost position on the light exit-side deflection portion 542A in the width direction. Similarly, the angle γ3 formed between each inclined surface of the light entrance-side deflection portion 544A and a plane parallel to the display surface 511A1 gradually increases with distance from the innermost position on the light entrance-side deflection portion 544A in the width direction.

The shape of the light exit-side deflection portion 542A and the shape of the light entrance-side deflection portion 544A, each defined by the flat surfaces, can approximate a curved surface convexed toward the viewer.

Therefore, the array-type display apparatus 700 of this embodiment, including the transparent plate 520A having the polygonally curved light exit-side deflection portion 542A and the polygonally curved light entrance-side deflection portion 544A, can achieve the same effects as the above-described array-type display apparatus 600 which includes the transparent plate 520A having the light exit-side deflection portion 522A and the light entrance-side deflection portion 524A.

Though in this embodiment the light exit-side deflection portion 542A and the light entrance-side deflection portion 544A of the transparent plate 520A each consist of a number of inclined surfaces, the present invention is not limited to such light exit-side and light entrance-side deflection portions. For example, it is possible to use light exit-side and light entrance-side deflection portions each consisting of a curved surface, curved surfaces arranged in the inner-outer direction, inclined surfaces arranged in the inner-outer direction, or at least one curved surface and at least one inclined surface, arranged in the inner-outer direction.

Variations of the Second Embodiment

The present invention is not limited to the second embodiment and the modification described above, but is capable of various changes and modifications within the scope of the inventive concept as expressed herein.

Figure 20:
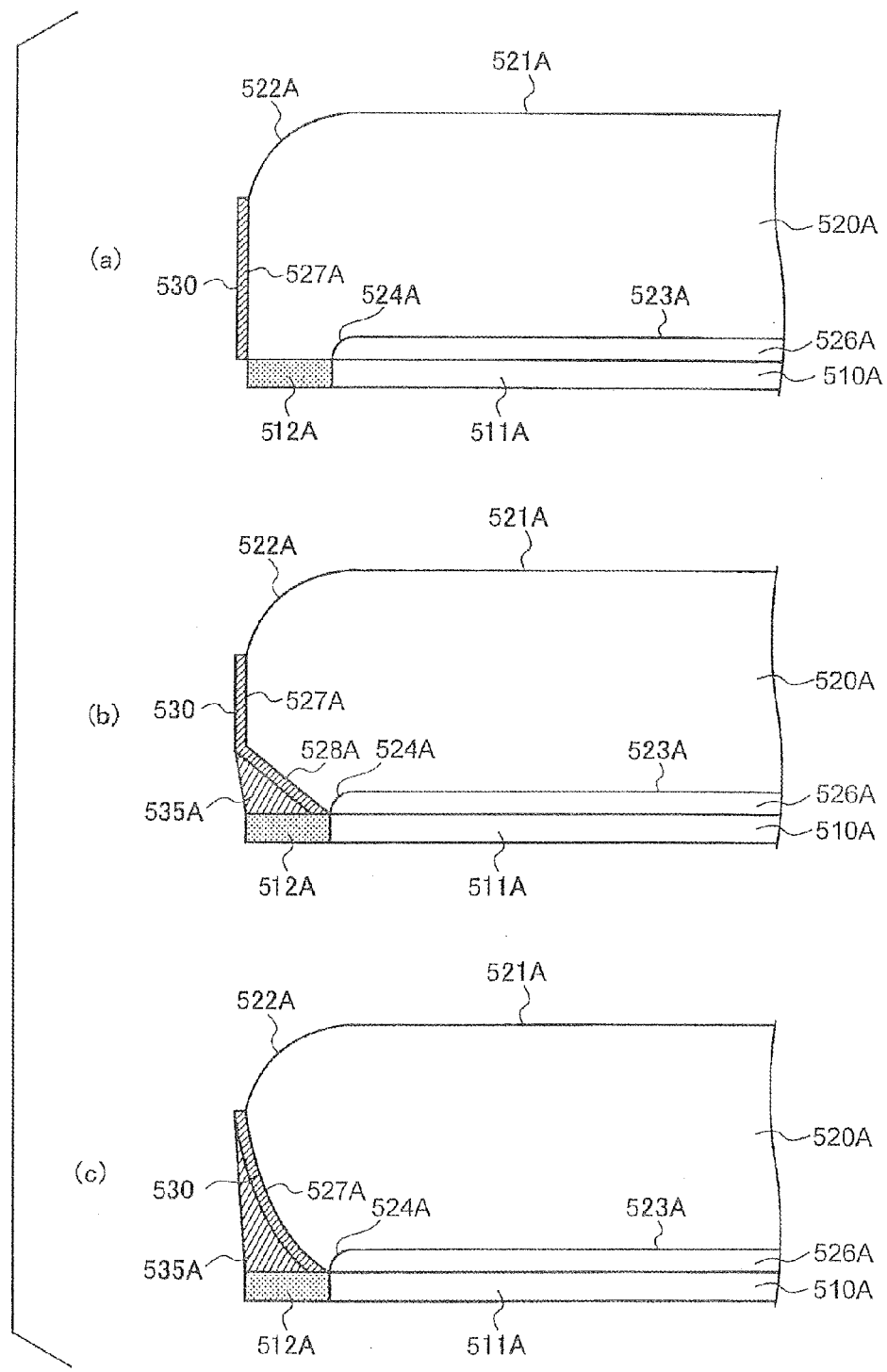
FIG. 20 shows diagrams illustrating variations of a transparent plate shown in FIG. 12.

FIG. 20 shows diagrams illustrating variations of the transparent plates 520A to 520D.

Figure 21:
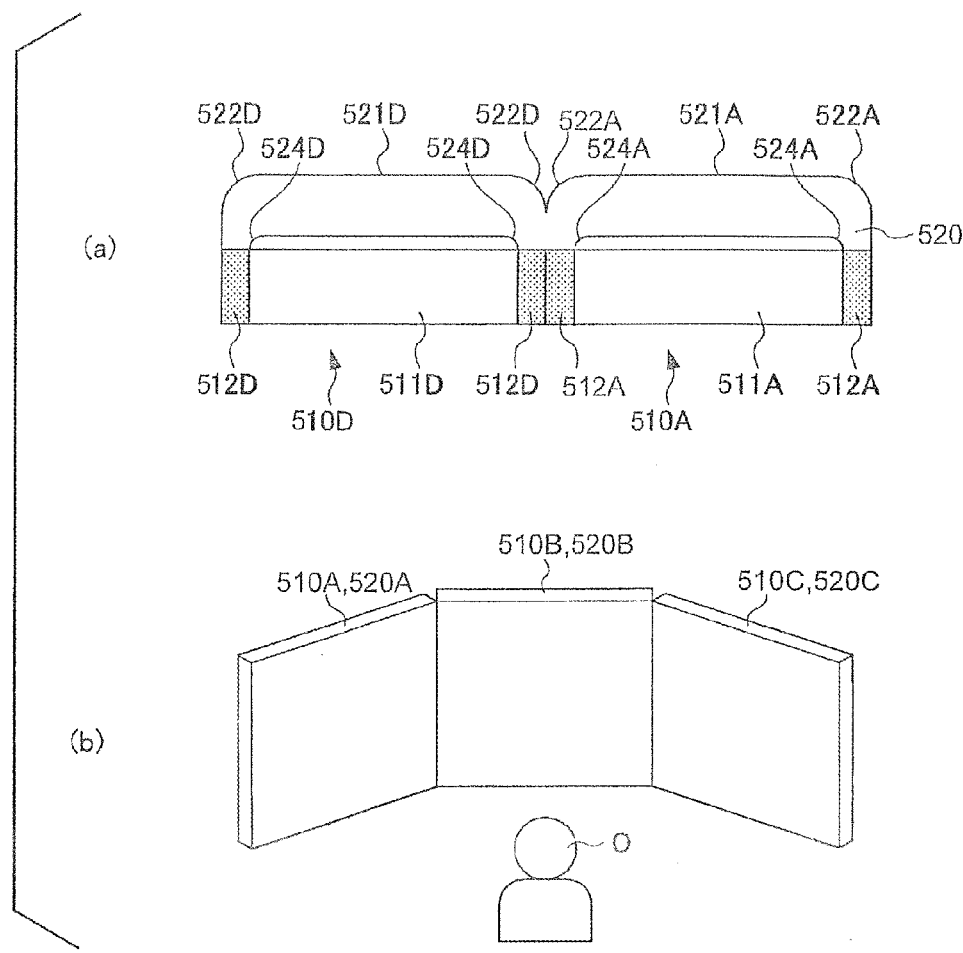
FIG. 21 shows diagrams illustrating variations of the array-type display apparatus shown in FIG. 12.

FIG. 21 shows diagrams illustrating variations of the array-type display apparatuses 600, 700.

While FIGS. 20 and 21 and the following description solely illustrate the transparent plate 520A and the display device 510A for easier understanding, the illustration holds true for the other transparent plates 520B to 520D and the other display devices 510B to 510D.

(1) In the second embodiment and the modification described above, the light exit-side deflection portion 522A or 542A and the light entrance-side deflection portion 524A or 544A are each a curved surface or each consist of a number of flat surfaces (inclined surfaces); however, one of the light exit-side deflection portion 522A or 542A and the light entrance-side deflection portion 524A or 544A may be designed as a curved surface and the other may be designed as a polygonally curved surface.

(2) In the second embodiment and the modification described above, the side surface 527A of the transparent plate 520A, lying nearer to the display device section 510 than the light exit-side deflection portion 522A or 542A, is a flat surface parallel to the normal direction nd of the display surface (viewer-side surface) of the display section 511A; however, the side surface 527A may be a curved surface or may be comprised of a combination of flat surfaces and/or curved surfaces. Further, a reflective layer, for example, may be formed on the side surface 527A. The same holds true for the other transparent plates 520B to 520D and also for the transparent plates 520A to 520D of the modification shown in FIG. 19.

For example, as shown in FIG. 20(a), it is possible to form a reflective layer 530, which is capable of reflecting light, on the side surface 527A of the transparent plate 520A. By causing incident light to reflect from the reflective layer 530 and allowing part of the reflected light to exit the light exit-side deflection portion 522A or 542A, it becomes possible to further reduce the visibility of the non-display portion (joint portion) and enhance image continuity. The reflective layer 530 may have surface irregularities (i.e. concavity and convexity) on the side facing the side surface 527A. The surface irregularities diffusedly reflex light that enters the side surface 527A. This can increase the amount of light which is reflected from the side surface 527A and exits the light exit-side deflection portion 522A or 542A, thereby enhancing image continuity.

As shown in FIG. 20(b), at least part of the side surface 527A may be an inclined surface 528A. Further, a reflective layer 530 may be formed on the entire side surface 527A including the inclined surface 528A.

As shown in FIG. 20(c), it is also possible to design the side surface 527A as a curved surface, and to form a reflective layer 530 on the curved surface.

A bonding layer 535A may be provided as illustrated in FIGS. 20(b) and 20(c) to increase the bonding strength between the transparent plate 520A and the display device 510A.

The above construction can increase the amount of light which is reflected from the side surface 527A and the inclined surface 528A, and exits the light exit-side deflection portion 522A or 542A, thereby enhancing image continuity. As described above, the reflective layer 530 may have surface irregularities on the side facing the side surface 527A.

Instead of providing surface irregularities to the reflective layer 530, it is possible to provide surface irregularities to the side surface 527A (and the inclined surface 528A).

(3) In the second embodiment and the modification described above, the transparent plate section 520 is comprised of an array of the transparent plates 520A to 520D which are separate members and arranged adjacent to each other; however, the transparent plates 520A to 520D may be comprised of parts of a single plate-like member. FIG. 21(a) shows a variation of the array-type display apparatus 600 or 700 in a cross-section corresponding to the cross-section taken along the line C-C of FIG. 12, illustrating the variation in which the transparent plate section 520 is comprised of a single plate-like member. The use of such a transparent plate section 520 allows the viewer to more perceive the display screen, on which an image is displayed, as one screen. This allows the viewer to view an image with enhanced continuity.

(4) In the second embodiment and the modification described above, the display devices 510A to 510D and the transparent plates 520A to 520D are arranged planarly in the array-type display apparatus 600, 700; however, it is also possible to arrange constituent display devices in a non-planar manner. For example, as shown in FIG. 21(b), the display devices 510A to 510C and the transparent plates 520A to 520C may be arranged such that the adjacent display screens make an angle with each other. This can improve the convenience and the design of the array-type display apparatus and makes it possible to display an image to the viewer O in a manner suited for the intended use and the environment.

(5) In the second embodiment and the modification described above, the display surfaces (viewer-side surfaces) of the display sections 511A to 511D of the display devices 510A to 510D are flat surfaces; however, the display surfaces may be curved surfaces, such as a cylindrical surface or a spherical surface. When using curved display surfaces, the transparent plates 520A to 520D (especially the planar portions 521A to 521D, 523A to 523D) may have a shape that follows the shape of the display surfaces of the display sections 511A to 511D of the display devices 510A to 510D.

(6) Depending on the intended optical performance, etc., the transparent plates 520A to 520D may optionally contain a diffusing agent, or may have a matte surface. Further, various functional layers, such as an anti-glare layer, an antireflection layer, a hard coat layer, an antifouling layer, an antistatic layer, an ultraviolet absorbing layer, a touch panel layer, etc. may be provided on the viewer side of the transparent plates 520A to 520D.

(7) In the second embodiment and the modification described above, the array-type display apparatus 600, 700 is comprised of an array of the display devices 510A to 510D and the corresponding array of the transparent plates 520A to 520D; however, a transparent plate, e.g. the transparent plate 520A, may be provided in a common display device (e.g. comprised solely of the display device 510A) so as to reduce the visibility of a non-display area composed of a frame member or the like.

The modifications and variations described hereinabove may also be made in an appropriate combination to the first or second embodiment, though a detailed description thereof is omitted. For example, the array-type display apparatus of the second embodiment may have the corner deflection portions according to the first embodiment. With the provision of the transparent plate section comprised of the transparent plates each having the corner deflection portions, such an array-type display apparatus can significantly reduce the visibility of a joint portion, can display an image with high continuity, and can display a good image comparable to an image as displayed on a single display device.

The present invention is not limited to the embodiments described above.

The invention claimed is:

1. An array display apparatus comprising:
   display devices each including a display section capable of displaying an image, and a non-display area located around the display section and incapable of displaying an image;
   and transparent plates each disposed nearer to the viewer than the display section of a corresponding display device and covering the display section and the non-display area of the corresponding display device,
   wherein the display devices and the transparent plates each have a polygonal shape when viewed in a normal direction of a display surface of the display section,
   wherein adjacent transparent plates are disposed in contact with each other,
   wherein each transparent plate has:
   a light exit-side deflection portion for inwardly bending a traveling direction of at least part of light that has exited the display section and passed through the transparent plate, said light exit-side deflection portion being provided at least in an area of a peripheral part of a viewer-side surface, the area facing the non-display area when viewed in the normal direction of the display surface of the display section;
   corner deflection portions, provided at the corners of the viewer-side surface, for inwardly bending a traveling direction of at least part of light that has exited the corresponding display section and passed through the transparent plate,
   wherein the light exit-side deflection portion has a width larger than a width of the non-display area,
   wherein the light exit-side deflection portion has a curved surface, curved surfaces arranged in an inner-outer direction, inclined surfaces arranged in the inner-outer direction, or at least one curved surface and at least one inclined surface arranged in the inner-outer direction, and
   wherein in the light exit-side deflection portion, an angle formed between a tangent plane of a curved surface at a point on the deflection portion and a plane parallel to the display surface of the display section or an angle formed between an inclined surface at a point on the deflection portion and a plane parallel to the display surface of the display section increases as the point moves outward in the inner-outer direction,
   wherein the corner deflection portions each have a curved surface, curved surfaces arranged in the inner-outer direction, inclined surfaces arranged in the inner-outer direction, or at least one curved surface and at least one inclined surface arranged in the inner-outer direction,
   wherein in each corner deflection portion, an angle formed between a tangent plane of a curved surface at a point on the deflection portion and a plane parallel to the display surface of the display section or an angle formed between an inclined surface at a point on the deflection portion and a plane parallel to the display surface of the display section increases as the point moves outward in the inner-outer direction, and
   wherein when viewed in the normal direction of the display surface of the display section, an innermost point on each corner deflection portion lies on an outer side of an innermost point on the light exit-side deflection portion wherein the corner deflection portions are each inclined with respect to the light exit-side deflection portions and enhance image continuity at corners of the transparent plates.

2. The array display apparatus according to claim 1, wherein the corner deflection portions are formed in areas facing the corners of the non-display area.

3. The array display apparatus according to claim 1, wherein the following relation is satisfied:

$$2 \times W \leq W1 \leq 4 \times W$$

where W1 represents the width of the light exit-side deflection portion, and W represents the width of the non-display area, as viewed in the normal direction of the display surface of the display section.

4. The array display apparatus according to claim 1, wherein each transparent plate further has a light entrance-side deflection portion for outwardly bending a traveling direction of at least part of light that has exited the display section, said light entrance-side deflection portion being provided at least in an area of a peripheral part of a display device-side surface, the area facing the display section when viewed in the normal direction of the display surface of the display section.

5. The array display apparatus according to claim 4,
   wherein the light entrance-side deflection portion has a curved surface, curved surfaces arranged in an inner-outer direction, inclined surfaces arranged in the inner-outer direction, or at least one curved surface and at least one inclined surface arranged in the inner-outer direction, and
   wherein the outer side of the light entrance-side deflection portion is located nearer to the display device than the inner side thereof in the thickness direction of the transparent plate, and an angle formed between a tangent plane of a curved surface at a point on the light entrance-side deflection portion and a plane parallel to the display surface of the display section or an angle formed between an inclined surface at a point on the light entrance-side deflection portion and a plane parallel to the display surface of the display section increases as the point moves outward in the inner-outer direction.

6. The array display apparatus according to claim 4, wherein in each display device, an image formed on the display surface by light that exits that area of the display section which faces the light entrance-side deflection portion when viewed in the normal direction of the display surface of the display section, is reduced to W2/W1 (W1 is the width of the light exit-side deflection portion and W2 is the width of the light entrance-side deflection portion) of an image formed on the display surface by light that exits the other area of the display section wherein W1 is the width of the light exit-side deflection portion and W2 is the width of the light entrance-side deflection portion.

7. The array display apparatus according to claim 6, wherein the luminance of an image displayed on that area of the display section which faces the light entrance-side deflection portion is W1/W2 times the luminance of an image displayed on the other area of the display section.

8. The array display apparatus according to claim 4, wherein at least part of light that has entered the light entrance-side deflection portion in the normal direction of the display surface of the display section passes through the transparent plate and exits it through the light exit-side deflection portion in the normal direction of the display surface of the display section.

9. The array display apparatus according to claim 8, wherein light that has entered the light entrance-side deflection portion at an outermost point in the normal direction of the display surface of the display section passes through the transparent plate and exits it at a point lying nearest to the display device, on the light exit-side deflection portion in the normal direction of the display surface of the display section.

10. The array display apparatus according to claim 4, wherein the following relation is satisfied in a cross-section perpendicular to a side surface of the transparent plate and to the display surface of the display section:

$$H = W \times \tan \theta$$

where H represents the distance between a point T1 and a point T3, and W represents the distance between a point T2 and the point T3, the point T1 being a point lying nearest to the display device in the thickness direction of the transparent plate, on the light exit-side deflection portion, the point T2 being a outermost point on the light entrance-side deflection portion, and the point T3 being the point of intersection between the plane passing through the point T2 and parallel to the display surface of the display section, and the straight line passing through the point T1 and perpendicular to the display surface of the display section; and $\theta$ represents the angle of the traveling direction of light in the transparent plate with respect to a plane parallel to the display surface, when the light enters the transparent plate at the point T2, passes through the transparent plate and exits it at the point T1 in the normal direction of the display surface of the display section wherein $\Theta$ satisfies the inequality $0° \leq \Theta \leq 90°$.

* * * * *